(12) United States Patent
Fukui

(10) Patent No.: US 10,663,523 B2
(45) Date of Patent: May 26, 2020

(54) REMAINING STORED POWER AMOUNT ESTIMATION DEVICE, METHOD FOR ESTIMATING REMAINING STORED POWER AMOUNT OF STORAGE BATTERY, AND COMPUTER PROGRAM

(71) Applicant: The Ritsumeikan Trust, Kyoto (JP)

(72) Inventor: Masahiro Fukui, Shiga (JP)

(73) Assignee: The Ritsumeikan Trust, Kyoto (JP)

( * ) Notice: Subject to any disclaimer, the term of this patent is extended or adjusted under 35 U.S.C. 154(b) by 389 days.

(21) Appl. No.: 15/527,071

(22) PCT Filed: Oct. 14, 2015

(86) PCT No.: PCT/JP2015/079028
§ 371 (c)(1),
(2) Date: May 16, 2017

(87) PCT Pub. No.: WO2016/080111
PCT Pub. Date: May 26, 2016

(65) Prior Publication Data
US 2019/0094308 A1    Mar. 28, 2019

(30) Foreign Application Priority Data

Nov. 18, 2014    (JP) ................ 2014-233606

(51) Int. Cl.
*G01R 31/367*    (2019.01)
*H01M 10/48*    (2006.01)
(Continued)

(52) U.S. Cl.
CPC ......... *G01R 31/367* (2019.01); *G01R 31/389* (2019.01); *H01M 10/48* (2013.01);
(Continued)

(58) Field of Classification Search
CPC ... G01R 31/389; G01R 31/367; H01M 10/48; H02J 7/0047
See application file for complete search history.

(56) References Cited

U.S. PATENT DOCUMENTS 7,764,049 B2    7/2010    Iwane et al.
10,180,461 B2    1/2019    Wada et al.
(Continued)

FOREIGN PATENT DOCUMENTS

JP    2007-187534 A    7/2007
JP    2014-520254 A    8/2014
(Continued)

OTHER PUBLICATIONS

International Search Report dated Dec. 15, 2015 issued in corresponding PCT/JP2015/079028 application (2 pages).
(Continued)

*Primary Examiner* — Bryan Bui
(74) *Attorney, Agent, or Firm* — Millen, White, Zelano & Branigan, P.C.; William Nixon

(57) ABSTRACT

This remaining stored power amount estimation device 3 includes: sensors 5, 6 for observing the state of the storage battery 2; and a remaining amount estimation unit 15 which, on the basis of a state vector $x_k$ representing the state of the storage battery 2 by a plurality of elements included in an equivalent circuit model 20 modeling the storage battery 2, and an observation vector $y_k$ representing an observed value based on the observation result, updates the state of the storage battery 2, using a Kalman filter, and estimates the SOC of the storage battery 2. The remaining amount estimation unit 15 changes the internal impedance of the storage battery 2 modeled by the equivalent circuit model 20, in accordance with values influencing the internal impedance.

7 Claims, 23 Drawing Sheets

(51) Int. Cl.
*H02J 7/00* (2006.01)
*G01R 31/389* (2019.01)
*H01M 10/42* (2006.01)
*G01R 31/374* (2019.01)

(52) U.S. Cl.
CPC .......... *H02J 7/0047* (2013.01); *G01R 31/374* (2019.01); *H01M 2010/4271* (2013.01); *H02J 7/0048* (2020.01)

(56) References Cited

U.S. PATENT DOCUMENTS

| | | |
|---|---|---|
| 2009/0027007 A1 | 1/2009 | Iwane et al. |
| 2013/0013237 A1* | 1/2013 | Sato ................... G01R 31/3835 702/63 |
| 2013/0110429 A1 | 5/2013 | Mitsuyama et al. |
| 2014/0203813 A1 | 7/2014 | Driemeyer-Franco |
| 2015/0285869 A1 | 10/2015 | Wada et al. |
| 2016/0003912 A1 | 1/2016 | Iwane et al. |

FOREIGN PATENT DOCUMENTS

| | | |
|---|---|---|
| JP | 2014-178213 A | 9/2014 |
| WO | 2011/118080 A1 | 9/2011 |
| WO | 14084117 A1 | 6/2014 |

OTHER PUBLICATIONS

D. Haifeng et al., "State and Parameter Estimation of a HEV Li-ion Battery Pack Using Adaptive Kalman Filter with a New SOC-OCV Concept", 2009 International Conference on Measuring Technology and Mechatronics Automation, vol. 2, IEEE Computer Society (Apr. 2009) pp. 375-380.

Final Office Action issued by Japan Patent Office for Japanese application 2014-233606 dated Jan. 29, 2019 and machine translation thereof (pp. 1-2).

Notification of Reasons for Refusal dated Aug. 31, 2018 issued in corresponding JP 2014-233606 application (4 pages).

English Translation of JP 2014-178213 A published Sep. 25, 2014.

* cited by examiner

| the nominal voltage | 3.6V |
|---|---|
| The nominal capacity | 2250mAh |
| The upper limit voltage | 3.2V |
| The lower limit voltage | 3.0V |

(b)

| Environmental temperature | 0~45°C |
|---|---|
| The setting voltage | 3.00~3.2V |
| Discharge current | 1.125A(0.5C) |
| AC current | 8% of discharge current |
| Setting frequency | 3000~0.08Hz |

| | | |
|---|---|---|
| $R_0$ | CoefficientA | $-0.798282 \times SOC + 9.841551$ |
| | CoefficientB | $-2112.45$ |
| $R_1$ | CoefficientA | $7.38 \times 10^{-9} \times SOC^2 - 1.17 \times 10^{-8} \times SOC + 7.66 \times 10^{-9}$ |
| | CoefficientB | $-54819.34$ |
| $C_1$ | CoefficientA | $-1.19 \times 10^{-5} \times SOC^3 + 3.06 \times 10^{-5} \times SOC^2 - 2.53 \times 10^{-5} \times SOC + 8.58 \times 10^{-6}$ |
| | CoefficientB | $-13973.80$ |

(b)

| | | |
|---|---|---|
| $R_2$ | CoefficientA | $0.54 \times SOC^2 - 0.86 \times SOC + 0.56$ |
| | CoefficientB | $1518.42$ |
| $C_2$ | CoefficientA | $-7.53 \times 10^{-12} \times SOC^3 + 1.93 \times 10^{-11} \times SOC^2 - 1.60 \times 10^{-11} \times SOC + 5.42 \times 10^{-12}$ |
| | CoefficientB | $5071.15$ |

FIG. 16

| Environmental temperature | 15, 25, 35, 45°C |
|---|---|
| Depth of Discharge | 100% |
| The lower limit voltage | 3.00V |
| Discharge current | Random pulse |

FIG. 22

|  | EXPERIMENTAL EXAMPLE 1 | EXPERIMENTAL EXAMPLE 2 | EXPERIMENTAL EXAMPLE 3 |
|---|---|---|---|
| 15°C | 0.3792% | 1.9821% | 3.8444% |
| 25°C | 0.4819% | 0.8130% | 0.5680% |
| 35°C | 0.5374% | 1.1623% | 1.2079% |
| 45°C | 0.3141% | 0.9018% | 2.9969% |

REMAINING STORED POWER AMOUNT ESTIMATION DEVICE, METHOD FOR ESTIMATING REMAINING STORED POWER AMOUNT OF STORAGE BATTERY, AND COMPUTER PROGRAM

TECHNICAL FIELD

The present invention relates to a device for estimating a remaining stored power amount of a storage battery such as a lithium ion storage battery, and a method therefor, etc.

BACKGROUND ART

In recent years, as electric automobiles, hybrid automobiles, and the like increase and photovoltaic generation is prevailing, storage batteries for storing electric energy become increasingly important.

The storage battery is required to stably supply power to various devices in which the storage battery is incorporated, and therefore the state of the storage battery needs to be managed.

Examples of the states of the storage battery that should be managed include the temperature, the remaining stored power amount (state of charge), and the deterioration state of the storage battery. Among these, in particular, the state of charge (SOC) is a basic parameter indicating the state of the storage battery, and high accuracy is required for the estimation thereof.

Therefore, as an estimation method for the SOC of the storage battery, estimation methods such as an output voltage method, an internal resistance method, a current integration method, have been proposed conventionally. However, in order to achieve SOC estimation with higher accuracy, a method of estimating the SOC of the storage battery using a Kalman filter is sometimes employed (see, for example, NON PATENT LITERATURE 1).

The SOC estimation method using a Kalman filter has advantages that it is possible to predict the remaining amount with high accuracy, and in addition, that the remaining amount can be predicted even if the initial remaining amount of the storage battery is unknown.

CITATION LIST

Non Patent Literature

NON PATENT LITERATURE 1: Dai Haifeng, Wei Xuezhe, Sun Zechang, "State and Parameter Estimation of a HEV Li-ion Battery Pack Using Adaptive Kalman Filter with a New SOC-OCV Concept", 2009 International Conference on Measuring Technology and Mechatronics Automation Volume 2, IEEE Computer Society, April, 2009, pp. 375-380

SUMMARY OF INVENTION

Technical Problem

In the SOC estimation method using a Kalman filter, first, an equivalent circuit modeling a target storage battery is set, and the state of the storage battery represented by a plurality of elements included in the set equivalent circuit is estimated. Next, error between the estimated state of the storage battery and the observed state of the storage battery is calculated and the state of the storage battery is newly estimated, and thus the estimated state of the storage battery is sequentially updated.

The equivalent circuit of the storage battery represents the internal impedance of the storage battery by combining a resistance element and a capacitance element. In general, the characteristics of these elements are treated as constants.

However, it is considered that the internal impedance of the actual storage battery changes depending on the battery state, and this change can be one of factors that deteriorate the estimation accuracy of the SOC of the storage battery.

The present invention has been made in view of the above circumstances, and an object of the present invention is to provide a remaining stored power amount estimation device, a method for estimating a remaining stored power amount of a storage battery, and a computer program, that are capable of estimating the SOC of the storage battery with higher accuracy.

Solution to Problem (1) The present invention is a remaining stored power amount estimation device for estimating a remaining stored power amount of a storage battery, the remaining stored power amount estimation device including: an observation unit configured to observe a state of the storage battery; and an estimation unit configured to, on the basis of a state vector and an observation vector, update the state vector using a Kalman filter and estimate the remaining stored power amount of the storage battery, the state vector representing the state of the storage battery on the basis of an equivalent circuit modeling the storage battery, the observation vector representing an observed value based on a result of observation by the observation unit, wherein the estimation unit changes an internal impedance of the storage battery modeled by the equivalent circuit, in accordance with a value influencing the internal impedance.

In the remaining stored power amount estimation device configured as described above, the estimation unit changes the internal impedance of the storage battery modeled by the equivalent circuit, in accordance with the value influencing the internal impedance. Therefore, it is possible to more approximate the state vector updated by the estimation unit, to an actual state of the storage battery, as compared to a case of setting the internal impedance to be a constant as in the conventional example. As a result, it is possible to estimate the remaining stored power amount with higher accuracy.

(2) In the remaining stored power amount estimation device, preferably, the estimation unit changes, in accordance with the value influencing the internal impedance, two or more setting values among setting values set for elements for representing the internal impedance of the storage battery in the equivalent circuit.

In this case, the internal impedance can be changed in more detail, whereby it is possible to further approximate the state vector updated by the estimation unit, to an actual state of the storage battery.

(3), (4), (5) The value influencing the internal impedance may be a temperature of the storage battery. The value influencing the internal impedance may be the remaining stored power amount of the storage battery estimated by the estimation unit.

Further, the value influencing the internal impedance may be both a temperature of the storage battery and the remaining stored power amount of the storage battery estimated by the estimation unit.

(6) Further, the estimation unit may, while repeatedly updating the state vector, change the internal impedance of the storage battery modeled by the equivalent circuit, in accordance with the value influencing the internal impedance.

(7) In addition, the present invention is a method for estimating a remaining stored power amount of a storage battery, the method including: an observation step of observing a state of the storage battery; and an estimation step of, on the basis of a state vector and an observation vector, updating the state vector using a Kalman filter and estimating the remaining stored power amount of the storage battery, the state vector representing the state of the storage battery on the basis of an equivalent circuit modeling the storage battery, the observation vector representing an observed value based on a result of observation in the observation step, wherein, in the estimation step, an internal impedance of the storage battery modeled by the equivalent circuit is changed in accordance with a value influencing the internal impedance.

(8) In addition, the present invention is a computer program for causing a computer to execute a process for estimating a remaining stored power amount of a storage battery, the computer program causing the computer to execute: an observation step of observing a state of the storage battery; and an estimation step of, on the basis of a state vector and an observation vector, updating the state vector using a Kalman filter and estimating the remaining stored power amount of the storage battery, the state vector representing the state of the storage battery by a plurality of elements included in an equivalent circuit modeling the storage battery, the observation vector representing an observed value based on a result of observation in the observation step, wherein in the estimation step, an internal impedance of the storage battery modeled by the equivalent circuit is changed in accordance with a value influencing the internal impedance.

The method and the computer program configured as described above for estimating the remaining stored power amount of the storage battery enable the SOC of the storage battery to be estimated with higher accuracy.

Advantageous Effects of Invention

The present invention enables the remaining stored power amount of the storage battery to be estimated with higher accuracy.

BRIEF DESCRIPTION OF DRAWINGS

FIG. 6A is a diagram showing the specifications of the actual storage battery used in measurement of the internal impedance, and FIG. 6B is a diagram showing the condition of measurement of the internal impedance.

FIG. 14A is a diagram showing an example of a result of calculation of both coefficients A, B for the resistance value $R_0$, the resistance value $R_1$, and the capacitance $C_1$ by the above method on the basis of the measurement results shown in FIG. 8, FIG. 9, and FIG. 10, and FIG. 14B is a diagram showing an example of a result of calculation of both coefficients A, B for a resistance value $R_2$ and a capacitance $C_2$.

FIG. 16 is a diagram showing the test condition of a verification test.

FIG. 22 is a diagram showing a result of calculation of an average value of an error rate at each environmental temperature in each experimental example.

DESCRIPTION OF EMBODIMENTS

Hereinafter, preferred embodiments will be described with reference to the drawings.

1 System Configuration

Figure 1:
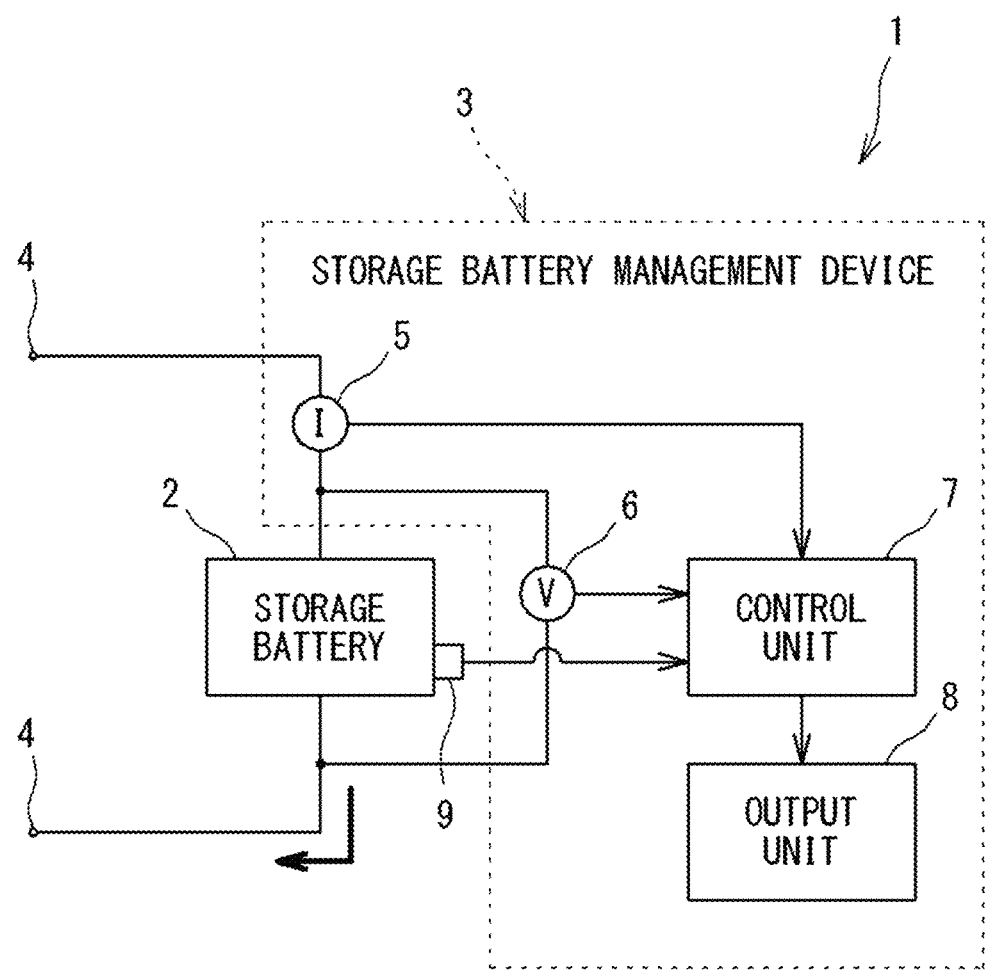
FIG. 1 is a block diagram of a storage battery system.

FIG. 1 is a block diagram of a storage battery system. In FIG. 1, the storage battery system 1 includes a storage battery 2 and a storage battery management device 3.

The storage battery 2 is formed of a single unit cell of a lithium ion battery or a plurality of unit cells thereof connected in series. When a charger (not shown) is connected to both end terminals 4, the storage battery 2 stores DC power, and when, instead of the charger, a load (not shown) is connected to the both end terminals 4, the storage battery 2 discharges the stored DC power to the load.

The storage battery management device 3 includes: a current sensor 5 for measuring a current value of DC power discharged from the storage battery 2; a voltage sensor 6 for measuring inter-terminal voltage of the storage battery 2; a temperature sensor 9 for measuring the environmental temperature of the storage battery 2; a control unit 7 which performs a process relevant to state management for the storage battery 2; and an output unit 8 which outputs a process result relevant to state management for the storage battery 2.

The current sensor 5 measures a current value of DC power in charging or discharging of the storage battery 2, and gives a measurement signal indicating a result of the measurement, to the control unit 7.

The voltage sensor 6 measures a voltage value of DC power in charging or discharging of the storage battery 2, and gives a measurement signal indicating a result of the measurement, to the control unit 7.

The temperature sensor 9 measures the environmental temperature which is the temperature around the storage battery 2 at present, and gives a signal indicating a result of the measurement, to the control unit 7.

The control unit 7 executes a process for estimating the remaining stored power amount of the storage battery 2 and estimating the deterioration degree of the storage battery 2, on the basis of the measurement signals provided from the sensors 5, 6, 9, and estimating the state of the storage battery 2, and executes a process for managing a result of the estimation.

Figure 2:
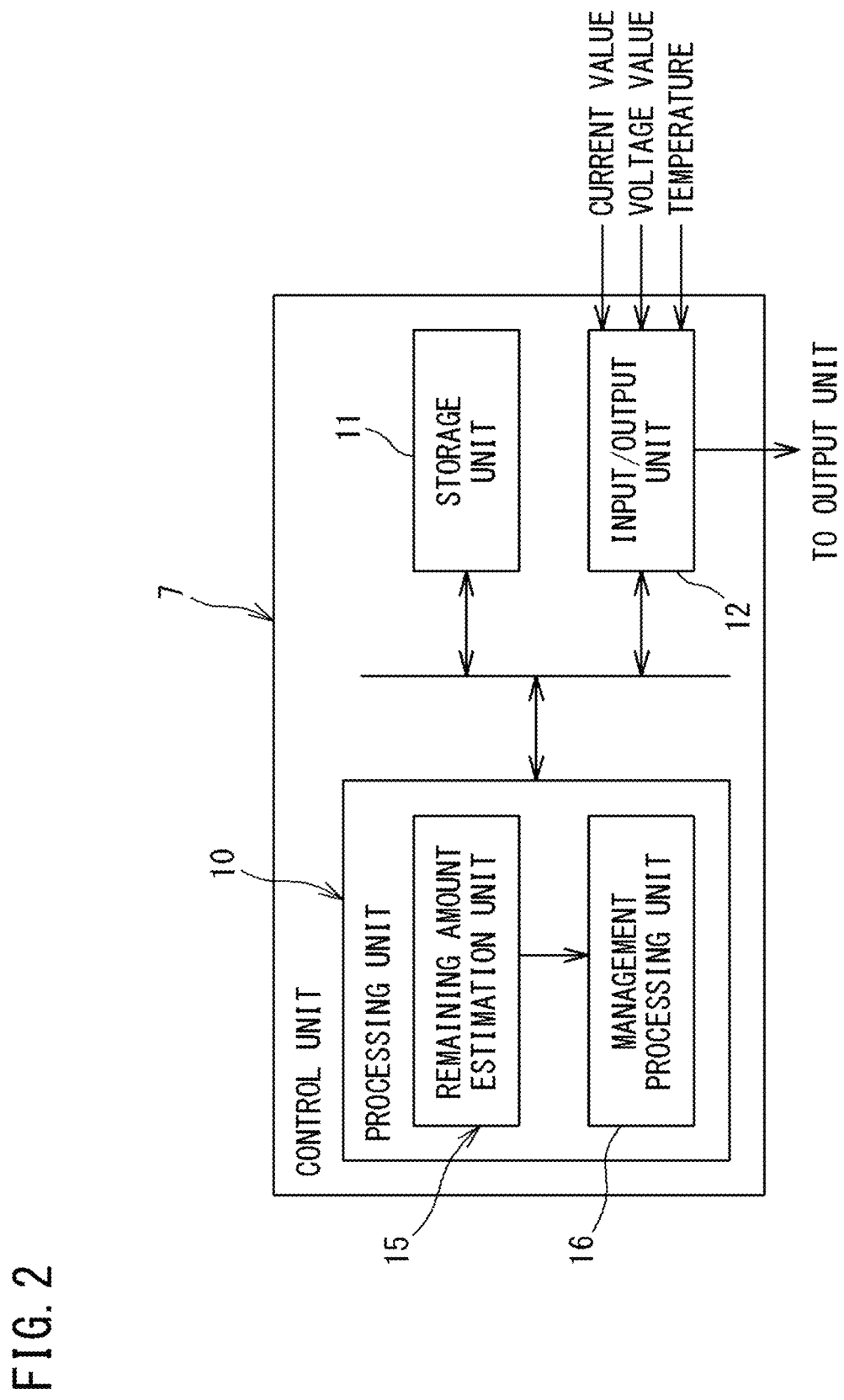
FIG. 2 is a block diagram showing the configuration of a control unit.

FIG. 2 is a block diagram showing the configuration of the control unit 7.

As shown in FIG. 2, the control unit 7 includes: a processing unit 10 including a processor and the like; a storage unit 11 formed from a ROM, a RAM, and the like; and an input/output unit 12, and is configured from a microcomputer.

The storage unit 11 stores an operating system needed for operating the control unit 7, and further, various computer programs for realizing the function of the control unit 7.

The input/output unit 12 has a function of receiving the measurement signals from the sensors 5, 6, 9. The signals received by the input/output unit 12 are stored in the storage unit 11 and used for various processes by the processing unit 10.

The processing unit 10 executes the computer programs stored in the storage unit 11, thereby realizing the following functions.

The processing unit 10 functionally has a remaining amount estimation unit 15 and a management processing unit 16, as shown in FIG. 2.

The remaining amount estimation unit 15 has a function for executing a process for estimating the remaining stored power amount of the storage battery 2. The remaining amount estimation unit 15 acquires the state of the storage battery 2 on the basis of the measurement signals from the sensors 5, 6, and calculates an estimated value of a state of charge (hereinafter, may be simply referred to as an SOC) which is a value indicating the remaining stored power amount of the storage battery 2. That is, the storage battery management device 3 in the present embodiment constitutes a remaining stored power amount estimation device that estimates the remaining stored power amount of the storage battery 2.

The management processing unit 16 estimates the deterioration degree of the storage battery 2 on the basis of the estimated value of the SOC calculated by the remaining amount estimation unit 15, and the measurement signals from the sensors 5, 6. Further, the management processing unit 16 has a function of outputting information about the state of the storage battery 2 such as the estimated value of the SOC and the estimated deterioration degree, via the input/output unit 12, to the output unit 8 (FIG. 1), and storing the information about the state of the storage battery 2 into the storage unit 11 and managing the information.

2 Estimation Process for SOC of Storage Battery

The remaining amount estimation unit 15 executes a process for calculating the estimated value of the SOC of the storage battery 2 as described above.

The remaining amount estimation unit 15 estimates the state of the storage battery 2, using various parameters included in an equivalent circuit modeling the storage battery 2.

Further, the remaining amount estimation unit 15 acquires an observed value of the storage battery 2 on the basis of the measurement signals from the sensors 5, 6.

Next, on the basis of the estimated state of the storage battery 2, and the observed value of the storage battery 2 based on the measurement signals from the sensors 5, 6, the remaining amount estimation unit 15 estimates the state of the storage battery 2 again, using a Kalman filter, and updates the estimated state of the storage battery 2.

The remaining amount estimation unit 15 acquires an estimated value of the SOC of the storage battery 2 on the basis of the state of the storage battery 2 which is sequentially estimated.

[2.1 Equivalent Circuit Model of Storage Battery 2]

Figure 3:
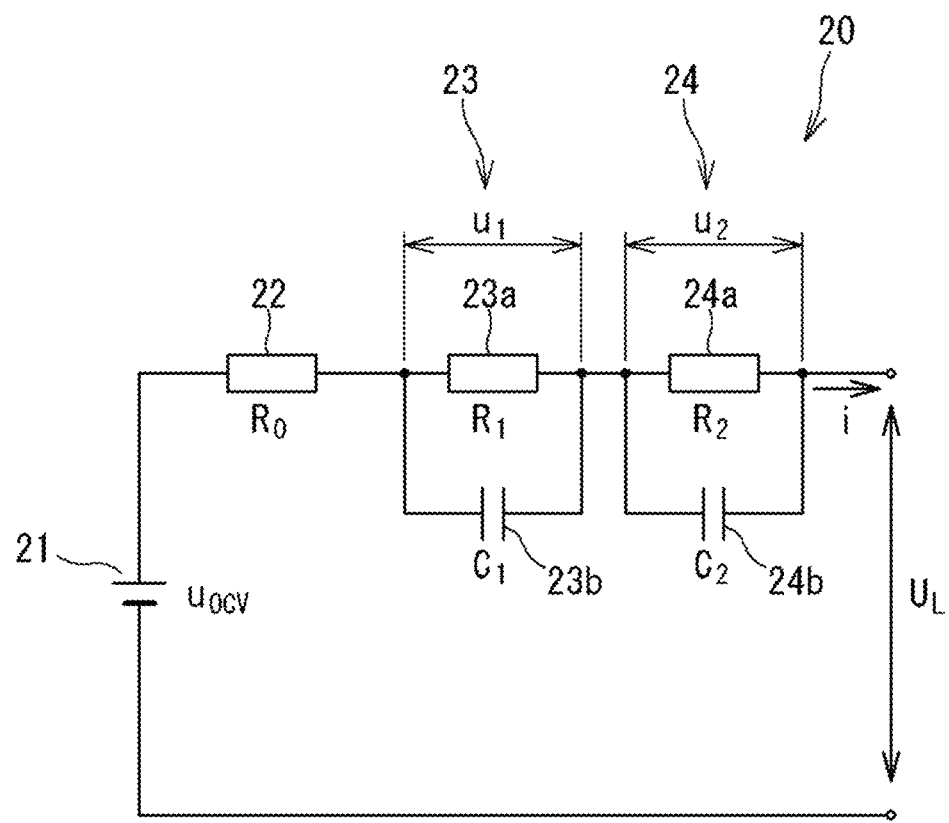
FIG. 3 is a diagram showing an equivalent circuit model of a storage battery, used in a process by a remaining amount estimation unit.

FIG. 3 is a diagram showing an equivalent circuit model of the storage battery 2, used in the process by the remaining amount estimation unit 15.

In FIG. 3, the equivalent circuit model 20 is composed of a power supply 21, a resistance element 22, a first RC circuit 23, and a second RC circuit 24.

The power supply 21 is an ideal power supply, and represents open circuit voltage (OCV: Open Circuit Voltage, hereinafter, may be simply referred to as an OCV) which is voltage of the storage battery 2 under no load.

The resistance element 22 represents the internal resistance of the storage battery 2, and is used for setting a DC component of, for example, a resistance of an electrolyte of the storage battery 2.

The first RC circuit 23 is formed from a resistance element 23a and a capacitor 23b connected in parallel. The first RC circuit 23 represents a dynamic behavior in an electric charge transfer process of the storage battery 2.

The second RC circuit 24 is formed from a resistance element 24a and a capacitor 24b connected in parallel. The second RC circuit 24 represents a dynamic behavior in a diffusion process of the storage battery 2.

Here, in a case where the OCV is $u_{OCV}$, the resistance value of the resistance element 22 is $R_0$, the resistance value of the resistance element 23a is $R_1$, the resistance value of the resistance element 24a is $R_2$, the capacitance of the capacitor 23b is $C_1$, and the capacitance of the capacitor 24b is $C_2$, voltage $u_1$ between both ends of the first RC circuit 23 and voltage $u_2$ between both ends of the second RC circuit 24 are represented by the following expressions (1) and (2), using differential equations.

Voltage $U_L$ between both ends of the storage battery 2 represented by the equivalent circuit model 20 can be represented by the following expression (3).

[Mathematical 1]

$$C_1 \frac{du_1}{dt} + \frac{u_1}{R_1} = i \tag{1}$$

$$C_2 \frac{du_2}{dt} + \frac{u_2}{R_2} = i \tag{2}$$

$$U_L = u_1 + u_2 + iR_0 + u_{OCV} \tag{3}$$

In the above expressions (1) to (3), i is current discharged to outside from the equivalent circuit model 20.

[2.2 Open Circuit Voltage of Storage Battery 2]

The control unit 7 stores, in the storage unit 11, a function indicating the relationship between the SOC and the OCV. The control unit 7 stores the function as information needed for executing the SOC estimation process described later.

The function can be calculated by regression from measurement values indicating the relationship between the SOC and the OCV obtained through an experiment using the storage battery 2.

Hereinafter, the way of calculating the function will be described.

First, the voltage value of the storage battery 2 when the storage battery 2 having an SOC of 0% is charged with such minute current that allows a load on the storage battery 2 to be neglected, is successively measured. Further, the voltage value of the storage battery 2 when the storage battery 2 having an SOC of 100% discharges such minute current that allows a load on the storage battery 2 to be neglected, is successively measured.

Next, an average value between each voltage value measured in charging and each voltage value measured in discharging, that correspond to each other, is calculated, and then the relationship between the voltage value and the SOC, constituted by the average values, is acquired as measurement values indicating the relationship between the SOC and the OCV when the storage battery 2 is charged and discharged.

Figure 4:
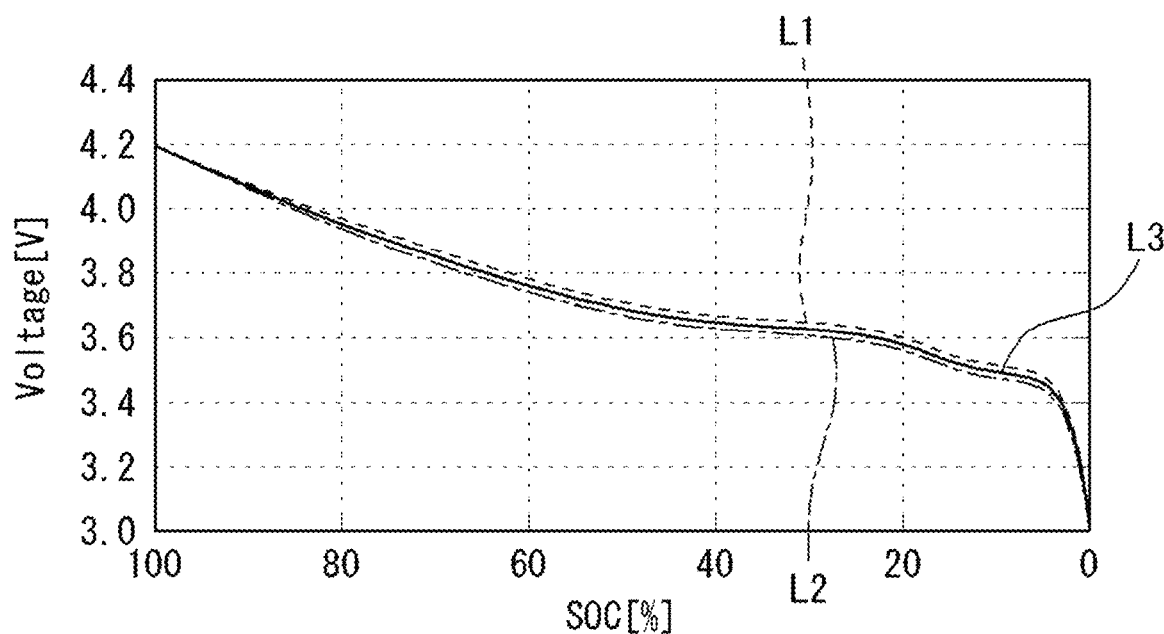
FIG. 4 is a graph showing an example of measurement values indicating the relationship between the SOC and OCV of the storage battery.

FIG. 4 is a graph showing an example of measurement values indicating the relationship between the SOC and the OCV of the storage battery 2. In FIG. 4, the horizontal axis indicates SOC (%), and the vertical axis indicates OCV (V).

In FIG. 4, a curve L1 obtained by plotting the voltage values measured in charging and a curve L2 obtained by plotting the voltage values measured in discharging have OCV values slightly deviating from each other, at the same SOC.

The measurement values indicating the relationship between the SOC and the OCV when the storage battery 2 is charged and discharged are constituted by the average values of the voltage values measured in charging and the voltage values measured in discharging, as described above. Therefore, a curve L3 indicating the relationship between the SOC and the OCV when the storage battery 2 is charged and discharged is located between the curve L1 and the curve L2.

Further, the measurement values calculated as described above and indicating the relationship between the SOC and the OCV when the storage battery 2 is charged and discharged, are regressed by, for example, a least squares method, into a polynomial shown by the following expression (4), thereby calculating the function.

[Mathematical 2]

$$OCV(SOC) = \sum_{i=0}^{12} a_i SOC^i \tag{4}$$

The OCV(SOC) which is the function indicating the relationship between the SOC and OCV is calculated as described above.

The control unit 7 stores the OCV(SOC) regressed by the above expression (4) which is the function indicating the relationship between the SOC and the OCV. In the present embodiment, the OCV is regressed by a twelfth-order polynomial as shown by expression (4).

[2.3 Influence of Polarization in Storage Battery 2]

In the equivalent circuit model 20, voltage change from when, after constant current i is discharged during a certain period, the discharging of the current i is eliminated (stopped), includes voltage due to polarization represented by the first RC circuit 23 and the second RC circuit 24 of the equivalent circuit model 20. The voltage $u_1$ between both ends of the first RC circuit 23 and the voltage $u_2$ between both ends of the second RC circuit 24 when considering the voltage due to polarization can be represented by the following expressions (5) and (6).

[Mathematical 3]

$$u_1 = u_1(0)(1 - e^{-t/\tau_1}) \tag{5}$$

$$u_2 = u_2(0)(1 - e^{-t/\tau_2}) \tag{6}$$

In the above expression (5), $u_1(0)$ and $u_2(0)$ are voltages at the moment when the current i is eliminated, and $\tau_1$ and $\tau_2$ are as follows.

$$\tau_1 = R_1 C_1$$

$$\tau_2 = R_2 C_2$$

If the period of discharging is sufficiently long, $u_1(0)$ and $u_2(0)$ can be approximated into $iR_1$ and $iR_2$.

Therefore, the voltage $U_L$ between both ends of the storage battery 2 represented by the equivalent circuit model 20 can be represented by the following expression (7) on the basis of the expression (3) and the function OCV(SOC) regressed by the above expression (4).

[Mathematical 4]

$$U_L = OCV(SOC) + iR_0 + u_1 + u_2 \tag{7}$$

[2.4 Change in Internal Impedance of Equivalent Circuit Model]

The internal impedance of the equivalent circuit model 20 of the storage battery 2 is represented by the resistance element 22, the first RC circuit 23, and the second RC circuit 24 as shown in FIG. 3.

The internal impedance of the equivalent circuit model 20 is determined by setting values (internal parameters) of the resistance element 22, the resistance element 23a of the first RC circuit 23, the capacitor 23b of the first RC circuit 23, the resistance element 24a of the second RC circuit 24, and the capacitor 24b of the second RC circuit 24, which are elements for representing the internal impedance.

In other words, the resistance value $R_0$ of the resistance element 22, the resistance value $R_1$ of the resistance element 23a, the capacitance $C_1$ of the capacitor 23b, the resistance value $R_2$ of the resistance element 24a, and the capacitance $C_2$ of the capacitor 24b are internal parameters (setting values) set for the elements for representing the internal impedance of the storage battery 2.

On the other hand, it is considered that the internal impedance of the actual storage battery 2 changes in accordance with an internal factor and an external factor regarding the storage battery 2.

Accordingly, the control unit 7 in the present embodiment stores, in the storage unit 11, information indicating the relationship between the internal parameters determining the internal impedance of the equivalent circuit model 20, and values influencing the internal impedance of the storage battery 2.

When executing the SOC estimation process described later, the control unit 7 refers to the information stored in the storage unit 11 and indicating the relationship between the internal parameters and the values influencing the internal impedance of the storage battery 2, and changes the internal parameters in accordance with the values influencing the internal impedance of the storage battery 2 at that time, thereby changing the internal impedance of the storage battery 2 modeled by the equivalent circuit model 20.

The information stored in the storage unit 11 and indicating the relationship between the internal parameters and the values influencing the internal impedance of the storage battery 2 is acquired on the basis of a Nyquist diagram obtained by measuring the internal impedance using the actual storage battery 2.

Hereinafter, an example of methods performed for acquiring the information indicating the relationship between the internal parameters and the values influencing the internal impedance of the storage battery 2 will be described. Here, as the values influencing the internal impedance of the storage battery 2, the environmental temperature and the SOC of the storage battery 2 were employed, and how the internal parameters changes in accordance with change in the environmental temperature and the SOC of the storage battery 2 was figured out, thereby formulating the internal parameters.

The internal impedance of the actual storage battery was measured by an AC impedance method in which the impedance is measured by applying AC voltage while changing the frequency thereof.

Figure 5:
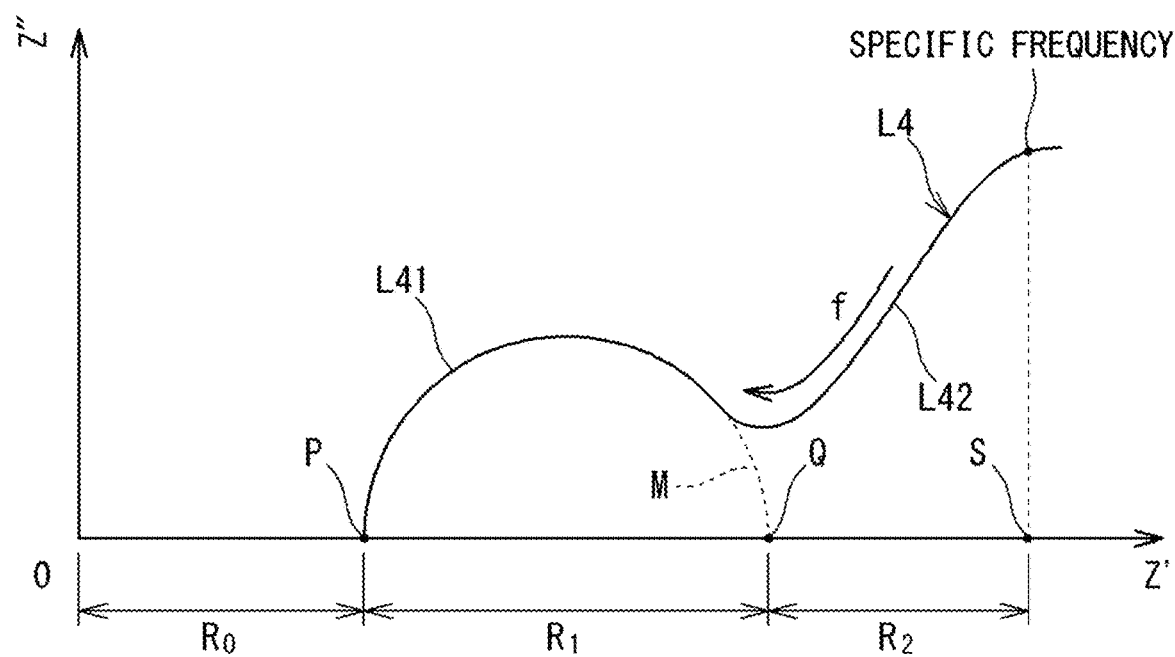
FIG. 5 schematically shows a Nyquist diagram indicating a result of measurement of the internal impedance of an actual storage battery.

FIG. 5 shows schematically a Nyquist diagram indicating a result of measurement of the internal impedance of the actual storage battery. In FIG. 5, the horizontal axis indicates a resistive component (Z') of the internal impedance of the storage battery, and the vertical axis indicates a capacitive component (Z") thereof.

As shown in FIG. 5, a line graph L4 indicating a result of measurement of the internal impedance is formed of a first semicircular part L41 in which the capacitive component increases from a point P, and a second semicircular part L42 connected to the first semicircular part L41. It is noted that, in the line graph L, the frequency increases from the right side to the left side on the drawing.

A range in which the resistive component is 0 to the point P is a range arising due to a DC component of, for example, the resistance of the electrolyte of the actual storage battery.

Therefore, a value corresponding to the resistance value $R_0$ of the resistance element 22 can be obtained by reading the value of the resistive component at the point P.

The first semicircular part L41 is a part in which a dynamic behavior in the electric charge transfer process of the actual storage battery appears.

Therefore, a value corresponding to the resistance value $R_1$ of the resistance element 23a of the first RC circuit 23 can be obtained by reading the value of the resistive component at a point Q at which a virtual line M of a semicircle that can be drawn along the first semicircular part L41 intersects the horizontal axis.

A value corresponding to the capacitance $C_1$ of the capacitor 23b of the first RC circuit 23 can be calculated by the following expression (8). In expression (8), f is the frequency when the capacitive component is maximum.

$$C_1 = 1/(2\pi R_1 f) \qquad (8)$$

The second semicircular part L42 is a part in which a dynamic behavior in the diffusion process of the actual storage battery appears.

Therefore, a value corresponding to the resistance value $R_2$ of the resistance element 24a of the second RC circuit 24 can be calculated on the basis of the second semicircular part L42. However, the second semicircular part L42 is not a semicircular shape like the first semicircular part L41, but appears as a linear shape. Therefore, the value of the resistive component at a preset specific frequency point S on the line graph L4 is used as the resistance value $R_2$, and the capacitance $C_2$ of the capacitor 24b is calculated on the basis of the resistance value $R_2$.

As described above, by reading the Nyquist diagram which is a result of measurement of the internal impedance of the storage battery, values corresponding to the resistance value $R_0$ of the resistance element 22, the resistance value $R_1$ of the resistance element 23a, the capacitance $C_1$ of the capacitor 23b, the resistance value $R_2$ of the resistance element 24a, and the capacitance $C_2$ of the capacitor 24b can be acquired.

FIG. 6A is a diagram showing the specifications of the actual storage battery used in measurement of the internal impedance. The actual storage battery used in the measurement is as shown in FIG. 6A and a lithium ion battery having a nominal capacitance of 2250 mAh and a nominal voltage of 3.6V was used.

The measurement of the internal impedance by the AC impedance method was performed by the following procedure. That is, first, the storage battery was set at a predetermined environmental temperature, and then the impedance was measured by applying AC voltage while changing the frequency thereof. Next, after the SOC was decreased by 0.1, the storage battery was left for three hours to wait for voltage recovery, and then the impedance was measured again. This procedure was repeated until the output voltage became 3.0V from a full-charge state (output voltage 3.2V).

FIG. 6B is a diagram showing a measurement condition for the internal impedance. As shown FIG. 6B, the frequency of AC voltage applied in the AC impedance method was changed in a range from 3 kHz to 0.08 Hz.

Figure 7:
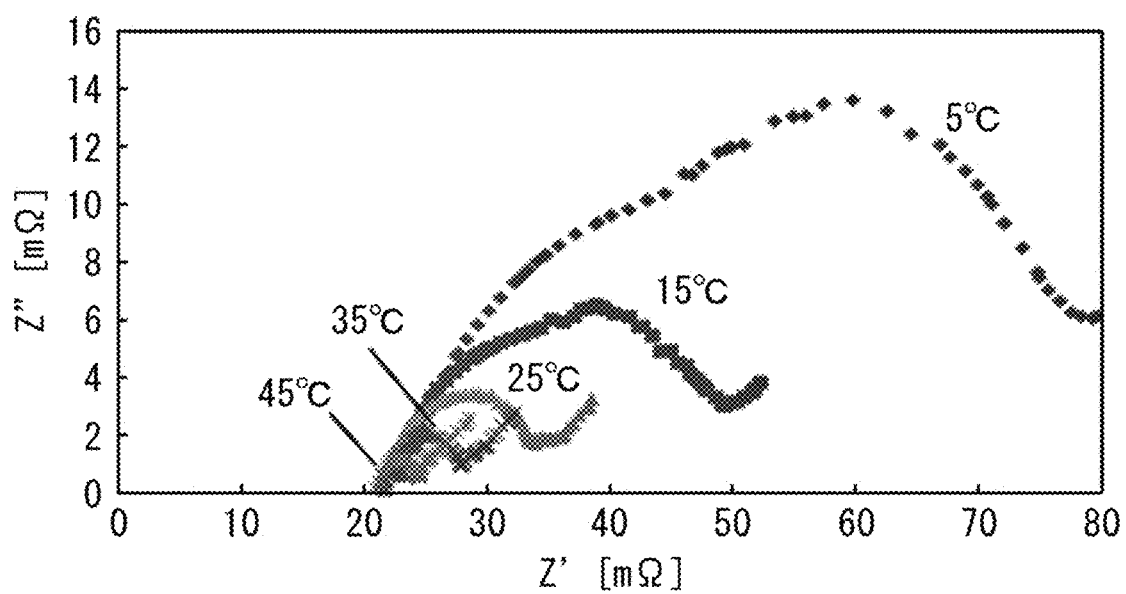
FIG. 7 is an example of a Nyquist diagram obtained by measuring the internal impedance of the actual storage battery.

FIG. 7 is an example of a Nyquist diagram obtained by measuring the internal impedance of the actual storage battery. In FIG. 7, Nyquist diagrams obtained by measuring the internal impedance at a plurality of environmental temperatures are shown in an overlapped manner.

By reading, by the above method, the Nyquist diagram obtained through actual measurement as shown in FIG. 7, the internal parameters at preset environmental temperature and SOC are acquired.

In the above manner, at each preset environmental temperature (from 0 to 45 degrees on a 5-degree basis), the internal impedance of the actual storage battery was measured while the SOC was changed.

Thus, change of each internal parameter in accordance with the environmental temperature and the SOC can be acquired.

Figure 8:
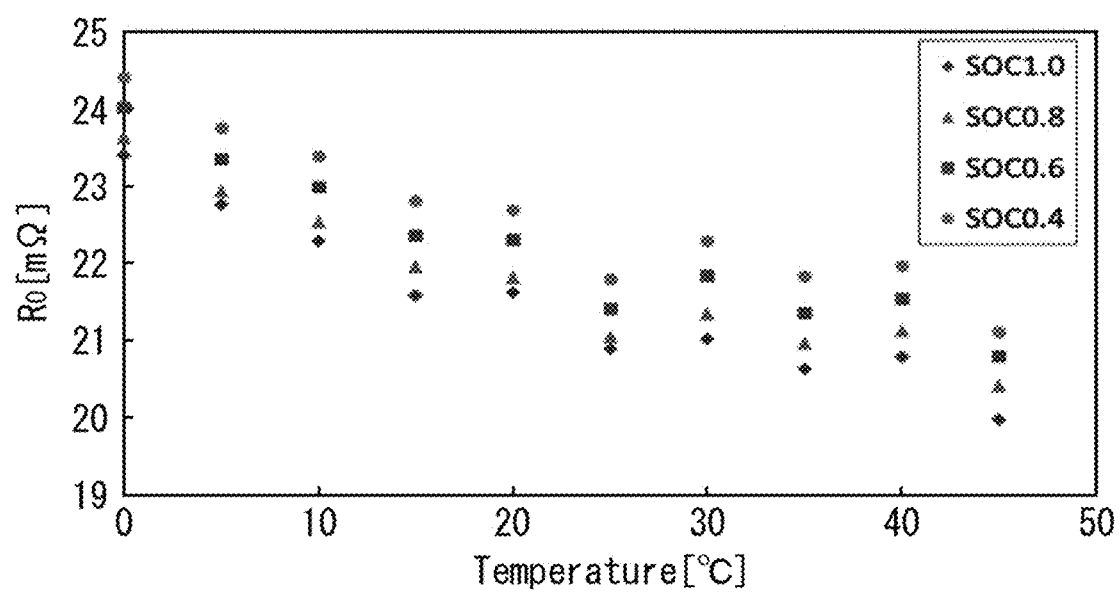
FIG. 8 is a diagram showing the relationship between each of the environmental temperature and the SOC, and a resistance value $R_0$ of a resistance element, obtained by measuring the internal impedance of the storage battery.

FIG. 8 is a diagram showing the relationship between each of the environmental temperature and the SOC, and the resistance value $R_0$ of the resistance element 22, obtained by measuring the internal impedance of the storage battery.

Figure 9:
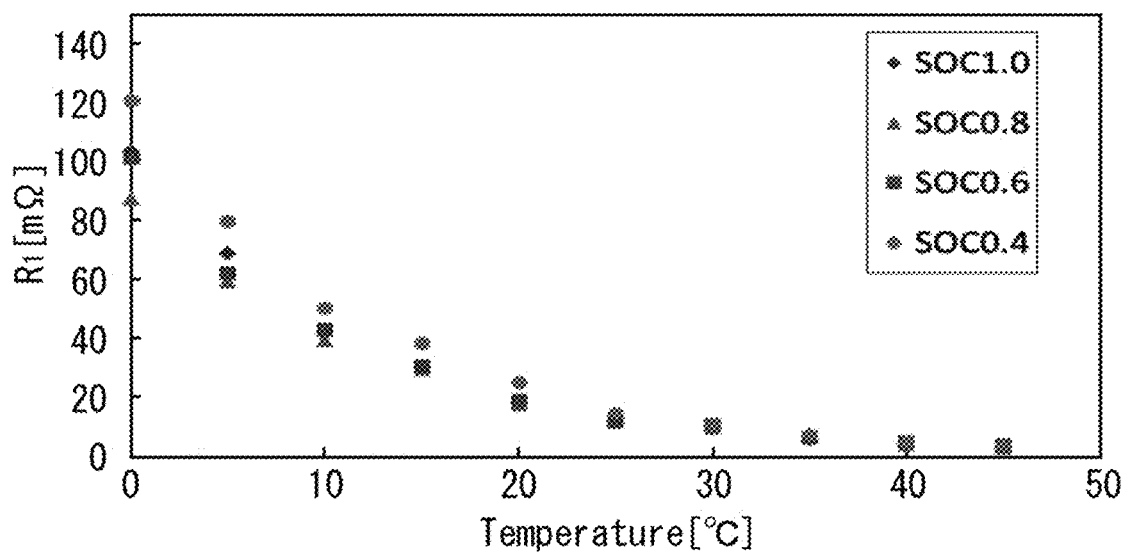
FIG. 9 is a diagram showing the relationship between each of the environmental temperature and the SOC, and a resistance value $R_1$ of a resistance element, obtained by measuring the internal impedance of the storage battery.

FIG. 9 is a diagram showing the relationship between each of the environmental temperature and the SOC, and the resistance value $R_1$ of the resistance element 23a, obtained by measuring the internal impedance of the storage battery.

Figure 10:
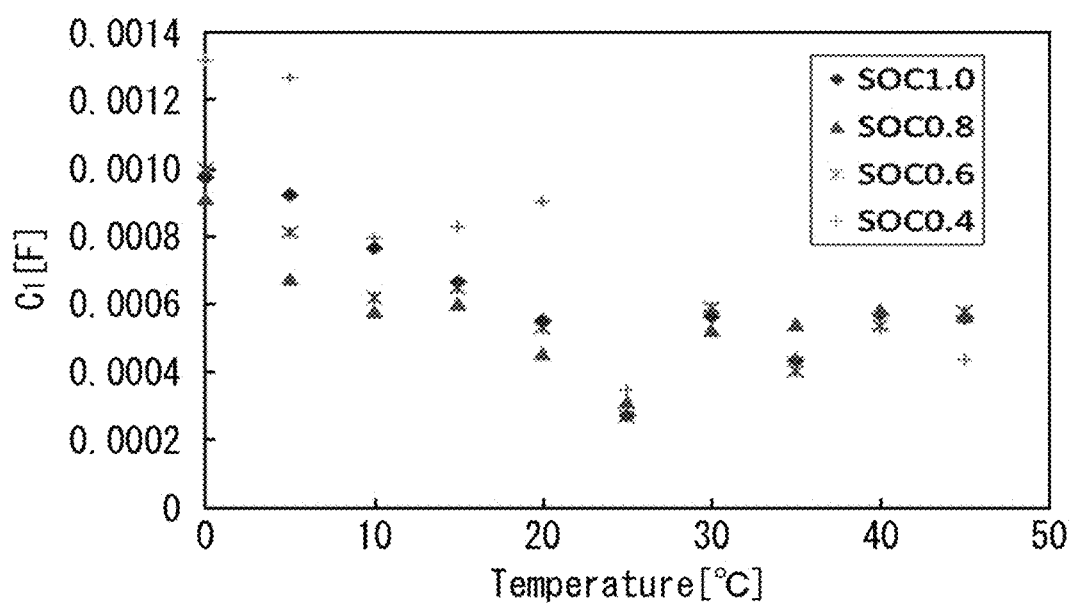
FIG. 10 is a diagram showing the relationship between each of the environmental temperature and the SOC, and a capacitance $C_1$ of a capacitor, obtained by measuring the internal impedance of the storage battery.

FIG. 10 is a diagram showing the relationship between each of the environmental temperature and the SOC, and the capacitance $C_1$ of the capacitor 23b, obtained by measuring the internal impedance of the storage battery.

In FIG. 8, the horizontal axis indicates the temperature (environmental temperature), and the vertical axis indicates the value of the resistance value $R_0$. In FIG. 9, the horizontal axis indicates the temperature (environmental temperature), and the vertical axis indicates the value of the resistance value $R_1$. In FIG. 10, the horizontal axis indicates the temperature (environmental temperature), and the vertical axis indicates the value of the capacitance $C_1$.

FIG. 8, FIG. 9, and FIG. 10 each show the relationship between the resistance value or the capacitance, and the environmental temperature, at each value of the SOC.

Here, since a reaction inside the storage battery is a chemical reaction, change of each internal parameter is assumed to be subject to the Arrhenius law, and as shown in the following expression (9), the relationship between each internal parameter, and the environmental temperature and the SOC which are the state of the storage battery, was formulated by being approximated by an Arrhenius equation.

[Mathematical 5]

$$\text{Internal parameter} = A \times e^{\frac{B}{RT}} \quad (9)$$

In the above expression (9), R is a gas constant, and T is an absolute temperature.

The above formulation was performed by specifying a coefficient A and a coefficient B that can be approximated into the relationship between each internal parameter, and the environmental temperature and the SOC, in the above expression.

For example, in a case of formulating the resistance value $R_0$, first, the measurement result indicating the relationship between the resistance value $R_0$, and the environmental temperature and the SOC shown in FIG. 8 is used.

For each SOC, the measurement result indicating the relationship between the resistance value $R_0$, and the environmental temperature and the SOC, is introduced into the above expression (9), an approximation function of the coefficient A and the coefficient B included in the expression (9) is calculated by applying a least squares method, and approximate values of the coefficient A and the coefficient B at each SOC are calculated.

Figure 11:
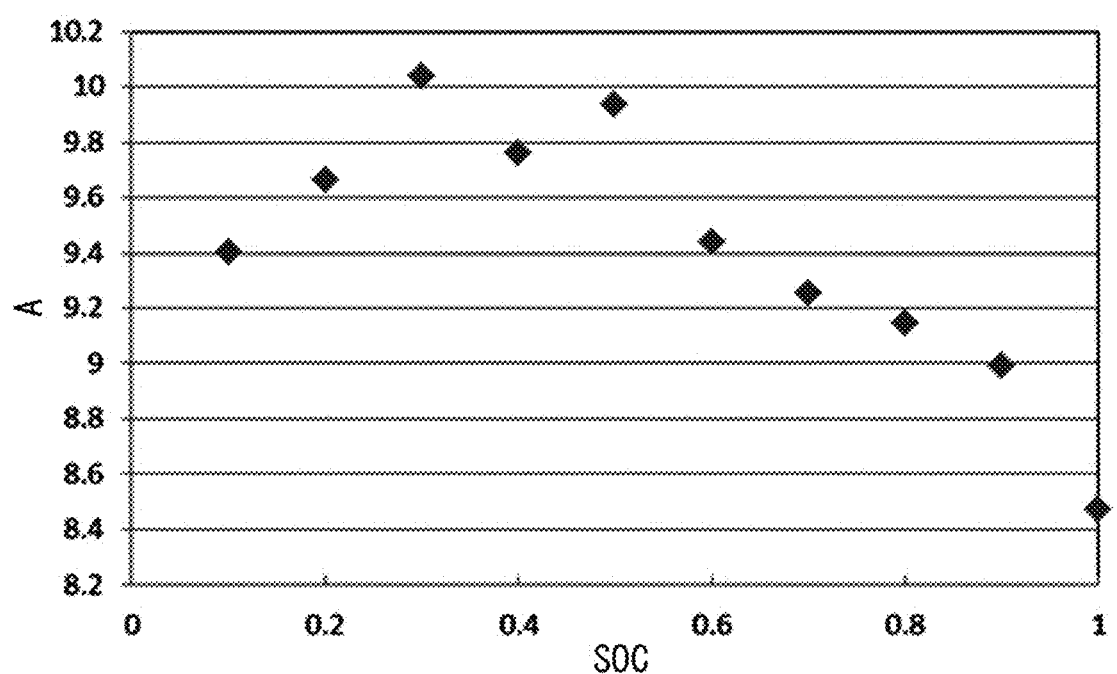
FIG. 11 is a diagram showing a result of calculation of an approximate value of a coefficient A, regarding the resistance value $R_0$.

FIG. 11 is a diagram showing a result of calculation of the approximate value of the coefficient A, regarding the resistance value $R_0$.

Figure 12:
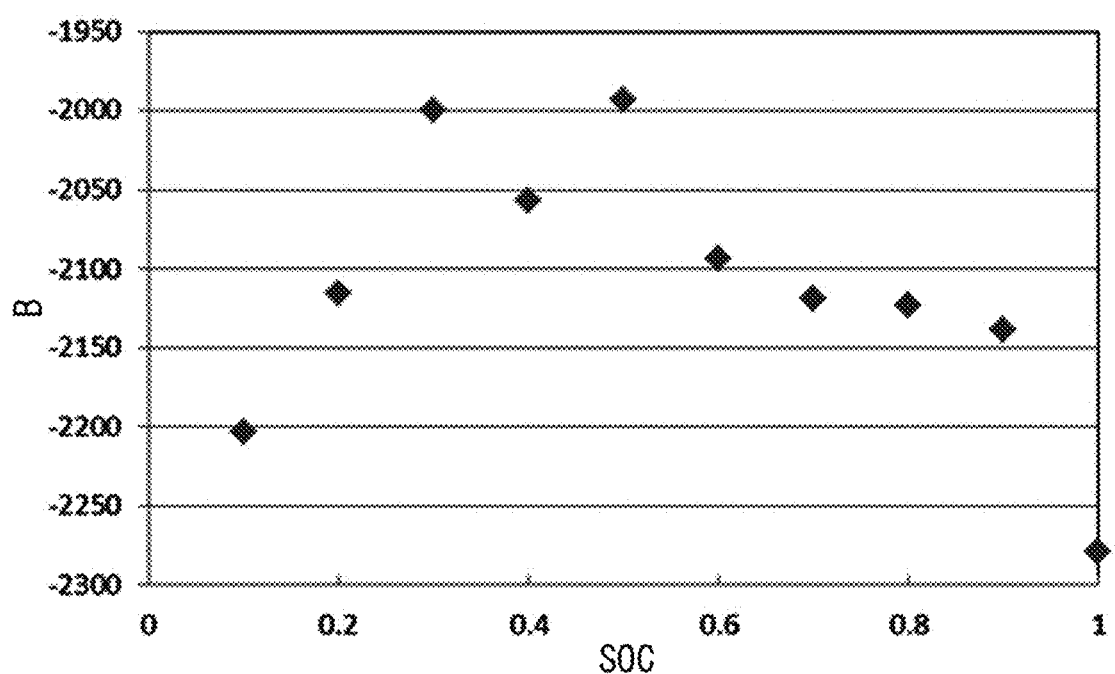
FIG. 12 is a diagram showing a result of calculation of an approximate value of a coefficient B, regarding the resistance value $R_0$.

FIG. 12 is a diagram showing a result of calculation of the approximate value of the coefficient B, regarding the resistance value $R_0$.

FIG. 11 and FIG. 12 each show approximate values of the coefficient A and the coefficient B at each value of the SOC.

After the approximate values of the coefficient A and the coefficient B included in expression (9) are calculated for each SOC by applying a least squares method as described above, the values of the coefficient B calculated at each SOC are summed to calculate an average value, and the average value is employed as the value of the coefficient B.

Figure 13:
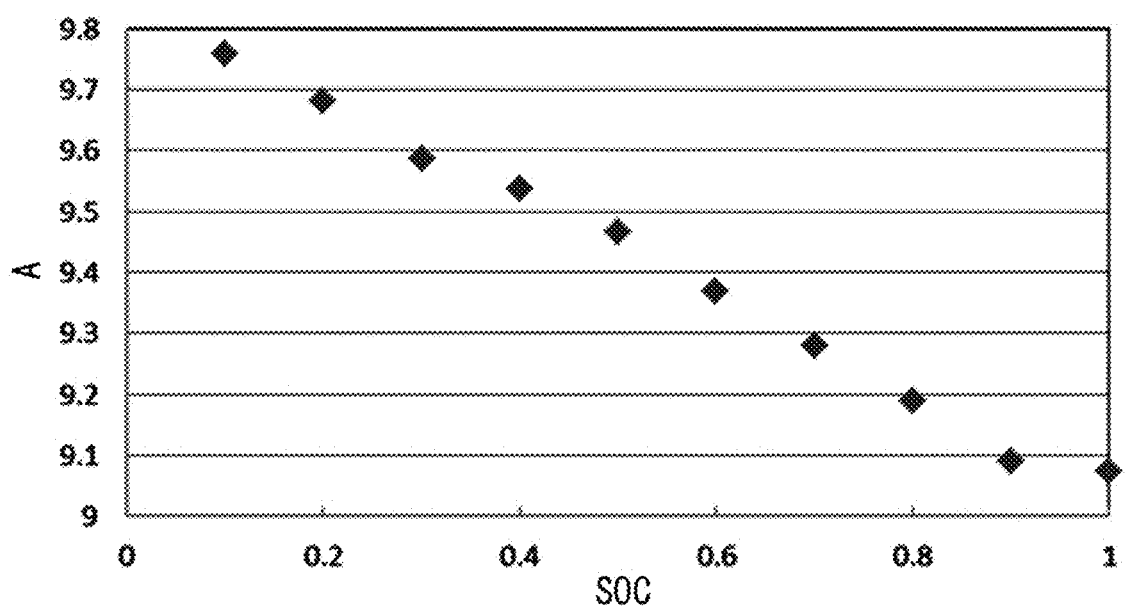
FIG. 13 is a diagram showing a result of calculation of an approximate value of the coefficient A, regarding the resistance value $R_0$, in a case where the approximate value of the coefficient A is calculated with the coefficient B set as a constant.

FIG. 13 is a diagram showing a result of calculation of the approximate value of the coefficient A, regarding the resistance value $R_0$, in a case where the approximate value of the coefficient A is calculated with the coefficient B set as a constant.

That is, if the coefficient B calculated above is substituted as a constant into the expression (9) and then the coefficient A is calculated for each SOC, a correlation is recognized between the coefficient A and the value of the SOC, as shown in FIG. 13.

Further, an approximation function of the coefficient A and the SOC is calculated by a least squares method.

By the calculated approximation function of the coefficient A and the SOC, the coefficient A can be represented as a function of the SOC.

As described above, the coefficient A is calculated as a function of the SOC, and the coefficient B is calculated as a constant.

By substituting the calculated coefficient A and coefficient B into the above expression (9), the resistance value $R_0$ which is the internal parameter can be formulated as a function of the environmental temperature and the SOC of the storage battery 2.

Also the resistance value $R_1$ and the capacitance $C_1$ which are other internal parameters can be formulated by calculating the coefficient A and the coefficient B by the same method.

In addition, it is necessary to formulate also the resistance value $R_2$ of the resistance element 24a and the capacitance $C_2$ of the capacitor 24b.

Regarding these values, as described above, a resistance value at a preset specific frequency is used as the resistance value $R_2$ of the resistance element 24a, but as in the other internal parameters, approximation was performed by an Arrhenius equation using these values, thereby performing formulation as a function of the environmental temperature and the SOC of the storage battery 2.

FIG. 14A is a diagram showing an example of a result of calculation of both coefficients A, B for the resistance value $R_0$, the resistance value $R_1$, and the capacitance $C_1$, by the above method on the basis of the measurement results shown in FIG. 8, FIG. 9, and FIG. 10.

FIG. 14B is a diagram showing an example of a result of calculation of both coefficients A, B for the resistance value $R_2$ and the capacitance $C_2$.

As shown in FIG. 14, the coefficient A and the coefficient B for each internal parameter are substituted into expression (9), whereby each internal parameter is formulated as a function of the environmental temperature and the SOC of the storage battery 2.

The expression (9) in which the coefficient A and the coefficient B are substituted represents each internal parameter as a function of the environmental temperature and the SOC of the storage battery 2. Further, the environmental temperature and the SOC, which are variables, of the storage battery 2 are variables independent of each other.

The formulated internal parameters calculated as described above are stored, in the storage unit 11, as the information indicating the relationship between the internal parameters and the values influencing the internal impedance of the storage battery 2.

When executing the SOC estimation process, the control unit 7 refers to the information indicating the formulated internal parameters, which is the information stored in the storage unit 11 and indicating the relationship between the internal parameters and the values influencing the internal impedance of the storage battery 2, and changes the internal parameters in accordance with the environmental temperature and the SOC of the storage battery 2 at that time, thereby changing the internal impedance of the storage battery 2 modeled by the equivalent circuit model 20.

[2.5 State of Storage Battery 2]

The remaining amount estimation unit 15 in the control unit 7 represents the state of the storage battery 2 as a system in a discrete time domain, and gives this system to a Kalman filter, thereby executing state estimation for the storage battery 2.

The following expressions (10) and (11) show a system model representing the state of the storage battery 2, which is assumed when the remaining amount estimation unit 15 executes the SOC estimation process. The expression (10) shows a system state equation indicating the state of the storage battery 2, and the expression (11) shows an observation equation according to the observed value of the storage battery 2. The system models shown by these expressions (10), (11) are non-linear models.

[Mathematical 6]

$$x_{k+1} = f(x_k) + b_u u_k + b\omega_k \qquad (10)$$

$$y_k = h(x_k) + v_k \qquad (11)$$

In the above expression (10), $x_k$ is a state vector indicating the state of the storage battery 2 at time k in a discrete time domain, $f(x_k)$ is a transition function indicating the relationship between the state vector $x_k$ at time k and a state vector $x_{k+1}$ at next time k+1, b is a constant, $u_k$ is a control input from outside, and $\omega_k$ is a system noise.

In the above expression (11), $y_k$ is an observation vector indicating the observed value of the storage battery 2 at time k, $h(x_k)$ is an observation function indicating the relationship between the state vector $x_k$ and the observation vector $y_k$ at time k, and $v_k$ is an observation noise.

As shown by the above expressions (10), (11), the remaining amount estimation unit 15 discretizes the state of the storage battery 2 in a time domain, and then executes state estimation for the storage battery 2.

In the above expressions (10), (11), the state vector $x_k$ is set as shown by the following expression (12). In addition, as shown by the following expression (13), the observation vector $y_k$ is set to the voltage $U_L$ between both ends of the storage battery 2 in the above expression (7).

[Mathematical 7]

$$x_k = [SOC(k) u_1(k) u_2(k)]^T \qquad (12)$$

$$y_k = U_L(k) \qquad (13)$$

As shown by the above expression (12), the state vector $x_k$ represents the state of the storage battery 2 by SOC(k), the voltage $u_1$ between both ends of the first RC circuit 23, and the voltage $u_2$ between both ends of the second RC circuit 24, which are a plurality of elements included in the equivalent circuit model 20.

Here, the above expressions (1), (2) are numerically analyzed by a forward Euler method, to calculate the relationships, between before and after unit time elapses, of the voltage $u_1$ between both ends of the first RC circuit 23 and the voltage $u_2$ between both ends of the second RC circuit 24, as represented by the following expressions (14), (15).

[Mathematical 8]

$$u_1(k+1) = \left(1 - \frac{\Delta t}{R_1 C_1}\right) u_1(k) + \frac{i}{C_1} \Delta t \qquad (14)$$

$$u_2(k+1) = \left(1 - \frac{\Delta t}{R_2 C_2}\right) u_2(k) + \frac{i}{C_2} \Delta t \qquad (15)$$

In the above expressions (14), (15), k is time in a discrete time domain, and $\Delta t$ is a sampling time.

Thus, in the present embodiment, the voltage $u_1$ between both ends of the first RC circuit 23 and the voltage $u_2$ between both ends of the second RC circuit 24 included in the equivalent circuit model 20 are discretized in a time domain, and thereby represented by linear functions having time k as a variable.

In addition, SOC(k) included in the state vector $x_k$ is also linear with respect to time k. Further, the internal resistance $R_0$ included in the state vector $x_k$ is a constant.

Thus, SOC(k), the voltage $u_1$ between both ends of the first RC circuit 23, and the voltage $u_2$ between both ends of the second RC circuit 24, which are a plurality of elements constituting the state vector $x_k$, are represented by a linear function having, as a variable, time k which is a variable according to the state of the storage battery 2, and the internal resistance $R_0$ of the storage battery 2 is represented by a constant.

That is, the plurality of elements included in the equivalent circuit model 20 include elements represented by functions having a variable (time k) according to the state of the storage battery 2, and all these functions are linear functions.

Further, by introducing the above expressions (14), (15) into the above expression (10), the state equation of the storage battery 2 is represented by the following expression (16).

[Mathematical 9]

$$\begin{aligned}
x(k+1) &= \begin{bmatrix} SOC(k+1) \\ u_1(k+1) \\ u_2(k+1) \end{bmatrix} \\
&= \begin{bmatrix} 1 & 0 & 0 \\ 0 & \left(1 - \frac{\Delta t}{R_1 C_1}\right) & 0 \\ 0 & 0 & \left(1 - \frac{\Delta t}{R_2 C_2}\right) \end{bmatrix} \times \begin{bmatrix} SOC(k) \\ u_1(k) \\ u_2(k) \end{bmatrix} + \begin{bmatrix} \frac{\Delta t}{C} \\ \frac{1}{C_1} \\ \frac{1}{C_2} \end{bmatrix} \times \\
&\quad i(k) + b\omega(k)
\end{aligned} \qquad (16)$$

In the above expression (16), C is the capacitance of the storage battery 2.

From the above expressions (7) and (13), the observation equation is represented by the following expression (17).

[Mathematical 10]

$$y(k) = U_L(k) \qquad (17)$$
$$= OCV(SOC) + i(k)R_0(SOC, T) + u_1(k) + u_2(k) + v_k$$

In expression (17), i(k) is discharge current of the storage battery 2 measured at time k, $u_1(k)$ is voltage between both ends of the first RC circuit 23 at time k, and $u_2(k)$ is voltage between both ends of the second RC circuit 24 at time k.

The OCV(SOC) is a function calculated by regression from the measurement values indicating the relationship between the SOC and the OCV when the storage battery 2 is actually charged and discharged.

The $R_0$(SOC, T) is the resistance value R0 of the resistance element 22 as a formulated internal parameter, and is represented by a function of the SOC and the environmental temperature T.

That is, in the observation equation, the observed value of the storage battery 2 actually measured (observed) by both sensors 5, 6, etc., is reflected, and the observation vector $y_k$ represents the observed value based on a result of observation of both sensors 5, 6 as an observation unit.

The system model represented by the above expression (16) is a linear model. Thus, the system model representing the state of the storage battery 2 is converted into a linear model by introducing the above expressions (14), (15) into the above expression (10) which is a non-linear model.

[2.6 State Estimation for Storage Battery 2]

The remaining amount estimation unit 15 in the control unit 7 executes state estimation for the storage battery 2 by an extended Kalman filter which performs linearization approximation by partial differentiation.

Therefore, the above expression (16) which is the state equation of the storage battery 2 is partially differentiated with respect to $x_k$. The following expression (18) shows, as $A_k$, a result of partial differentiation of expression (16) with respect to $x_k$.

[Mathematical 11]

$$\widehat{A_k} = \left.\frac{\partial f(x_k, u_k)}{\partial x_k}\right|_{x_k = \hat{x}_k^-} \qquad (18)$$

$$= \begin{bmatrix} 1 & 0 & 0 \\ 0 & \left(1 - \frac{\Delta t}{R_1 C_1}\right) & 0 \\ 0 & 0 & \left(1 - \frac{\Delta t}{R_2 C_2}\right) \end{bmatrix}$$

The above expression (17) which is the observation equation is also partially differentiated with respect to $x_k$. The following expression (19) shows, as $C_k$, a result of partial differentiation of expression (17) with respect to $x_k$.

[Mathematical 12]

$$\widehat{C_k} = \left.\frac{\partial h(x_k)}{\partial x_k}\right|_{x_k = \hat{x}_k^-} \qquad (19)$$

$$= \left[\frac{dOCV}{dSOC} + \frac{dR_0}{dSOC} \times i_k \bigg|_{SOC = \widehat{SOC}^-}, 1, 1\right]$$

The remaining amount estimation unit 15 executes state estimation for the storage battery 2, using a Kalman filter on the basis of the above expressions (18), (19).

Figure 15:
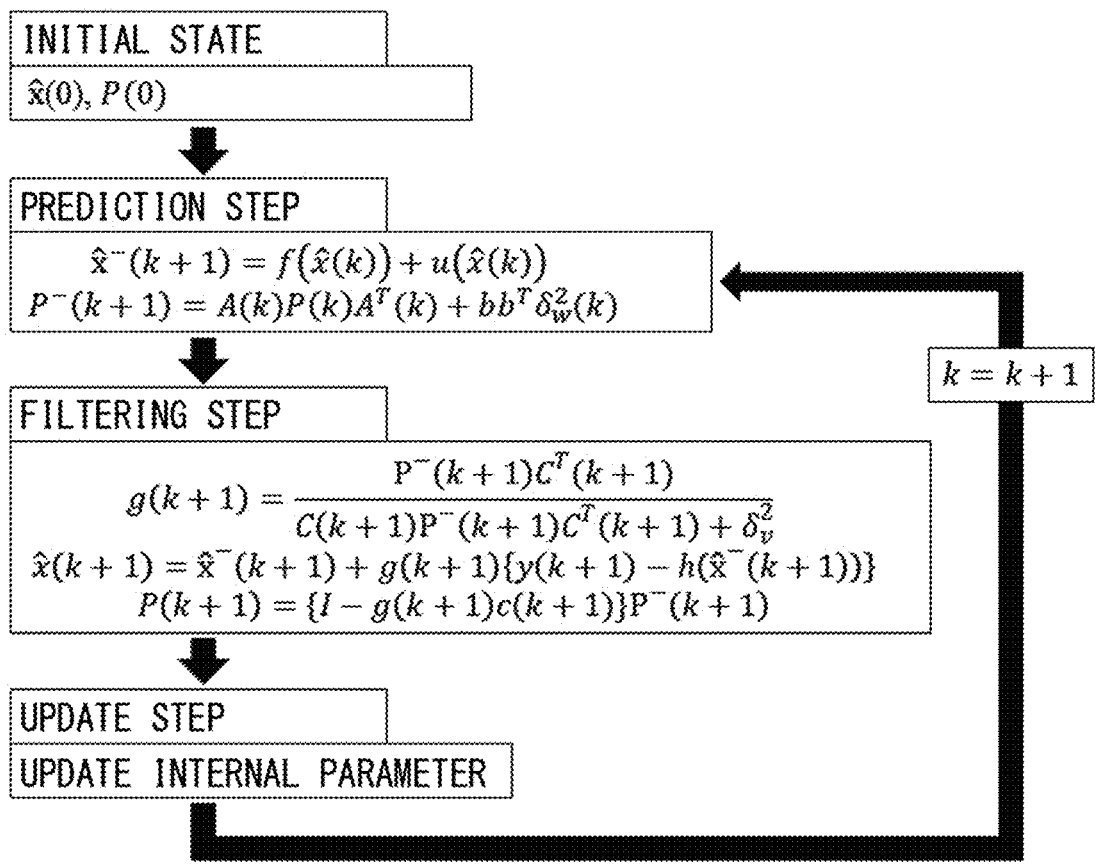
FIG. 15 is a diagram showing a process procedure of state estimation for the storage battery using a Kalman filter, executed by the remaining amount estimation unit.

FIG. 15 is a diagram showing the process procedure of state estimation for the storage battery 2 using a Kalman filter, executed by the remaining amount estimation unit 15.

It is noted that, in FIG. 15, a priori estimation value $\hat{x}^-(k)$, a posteriori estimation value $\hat{x}(k)$, and a priori error covariance $P^-(k)$ shown below in the specification are indicated as follows.

Priori estimation value $\hat{x}^-(k)$

Posteriori estimation value $\hat{x}(k)$

Posteriori error covariance $P^-(k)$       [Mathematical 13]

As shown in FIG. 15, first, the remaining amount estimation unit 15 sets an initial value $\hat{x}(0)$ of a posteriori estimation value $\hat{x}$ which is an estimated value of the state of the storage battery 2, and an initial value P(0) of a posteriori error covariance P used in a process described later.

After setting the initial value $\hat{x}(0)$ of the posteriori estimation value $\hat{x}$ and the initial value P(0) of the posteriori error covariance P, which indicate the initial state of the storage battery 2, the remaining amount estimation unit 15 proceeds to a prediction step in FIG. 15.

In the prediction step, the remaining amount estimation unit 15 calculates a priori estimation value $\hat{x}^-(k+1)$ and a priori error covariance $P^-(k+1)$ which are an estimated value of the state of the storage battery 2 at the next time (k+1), using the initial value $\hat{x}(0)$ of the posteriori estimation value $\hat{x}$ and the initial value P(0) of the posteriori error covariance P, in accordance with expressions indicated in the prediction step in FIG. 15.

The priori estimation value $\hat{x}^-(k+1)$ and the posteriori estimation value $\hat{x}(k+1)$ are state vectors indicating the state of the storage battery 2.

In the prediction step in FIG. 15, a term indicated by $\delta_w$ in the expression representing the priori error covariance $P^-(k+1)$ is a term relevant to system noise.

After calculating the priori estimation value $\hat{x}^-(k+1)$ and the priori error covariance $P^-(k+1)$, the remaining amount estimation unit 15 proceeds to a filtering step in FIG. 15.

The remaining amount estimation unit 15 having proceeded to the filtering step updates the priori estimation value $\hat{x}^-(k+1)$ and the priori error covariance $P^-(k+1)$ using a Kalman filter, to calculate, as the updated values thereof, the posteriori estimation value $\hat{x}(k+1)$ and the posteriori error covariance P(k+1).

In the filtering step, the remaining amount estimation unit 15 calculates a Kalman gain g(k+1) defined by the expression indicated in the filtering step in FIG. 15.

In addition, the remaining amount estimation unit 15 calculates the posteriori estimation value $\hat{x}(k+1)$ obtained by updating the priori estimation value $\hat{x}^-(k+1)$. As shown by the expression representing the posteriori estimation value $\hat{x}(k+1)$ in the filtering step in FIG. 15, the remaining amount estimation unit 15 corrects and updates the priori estimation value $\hat{x}^-(k+1)$ on the basis of the Kalman gain g(k+1) and an error value of the observation equation in which the actual observed value is reflected, thereby calculating the posteriori estimation value $\hat{x}(k+1)$.

A term indicated by $\delta_v$ included in the expression representing the Kalman gain g(k+1) is a term relevant to observation noise.

Further, the remaining amount estimation unit 15 calculates a posteriori error covariance P(k+1) obtained by updating the priori error covariance P⁻(k+1). As shown by the expression representing the posteriori error covariance P(k+1) in the filtering step in FIG. 15, the remaining amount estimation unit 15 updates the priori error covariance P⁻(k+1) on the basis of the Kalman gain g(k+1), thereby calculating the posteriori error covariance P(k+1).

Further, after calculating the Kalman gain g(k+1), the posteriori estimation value x̂(k+1), and the posteriori error covariance P(k+1), the remaining amount estimation unit 15 refers to the SOC included in the posteriori estimation value x̂(k), and acquires this SOC as an estimated value of the SOC of the storage battery 2.

Next, the remaining amount estimation unit 15 proceeds to an update step in FIG. 15, and changes the internal parameters (resistance value $R_0$, resistance value $R_1$, capacitance $C_1$, resistance value $R_2$, capacitance $C_2$) of the storage battery 2 which are included in the expressions used for state estimation for the storage battery 2 using a Kalman filter, in accordance with the SOC of the storage battery 2 acquired in the filtering step and the environmental temperature of the storage battery 2 at present obtained from the temperature sensor 9.

As described above, the storage unit 11 of the control unit 7 stores information about the internal parameters formulated as functions of the environmental temperature and the SOC, as information indicating the relationship between the internal parameters and the values influencing the internal impedance of the storage battery 2.

In the update step, the remaining amount estimation unit 15 refers to the information stored in the storage unit 11 and indicating the formulated internal parameters, and changes the internal parameters (internal impedance) of the storage battery 2 in accordance with the SOC of the storage battery 2 acquired in the filtering step and the environmental temperature of the storage battery 2 at present.

In the update step, after changing the internal parameters in accordance with the values (SOC and environmental temperature of the storage battery 2 at present) influencing the internal impedance of the storage battery 2 at present, the remaining amount estimation unit 15 updates "k+1" to "k" and returns to the prediction step again. The remaining amount estimation unit 15 calculates again the priori estimation value x̂⁻(k+1) and the priori error covariance P⁻(k+1) at the next time, using the posteriori estimation value x̂(k) and the posteriori error covariance P(k) updated in the filtering step.

Hereafter, the remaining amount estimation unit 15 repeats the above prediction step, filtering step, and update step, thereby repeatedly updating the posteriori estimation value x̂(k) and the posteriori error covariance P(k).

Thus, the remaining amount estimation unit 15 repeatedly estimates the posteriori estimation value x̂(k) which is the state vector indicating the state of the storage battery 2.

While repeatedly updating the posteriori estimation value x̂(k), the remaining amount estimation unit 15 changes the internal impedance (internal parameters) of the storage battery 2 modeled by the equivalent circuit model 20, in accordance with the values (SOC and environmental temperature of the storage battery 2 at present) influencing the internal impedance.

In the filtering step, the remaining amount estimation unit 15 acquires an estimated value of the SOC of the storage battery 2 every time the posteriori estimation value x̂(k) is sequentially estimated and updated.

The remaining amount estimation unit 15 gives the acquired estimated value of the SOC to the management processing unit 16, and outputs the same to the output unit 8 via the input/output unit 12.

As described above, on the basis of the state vector $x_k$ representing the state of the storage battery 2 by a plurality of elements included in the equivalent circuit model 20, and the observation vector $y_k$ representing the observed value based on the observation result, the remaining amount estimation unit 15 updates the state of the storage battery 2, using a Kalman filter, and estimates the SOC of the storage battery 2.

3 Effects

In the storage battery management device 3 of the present embodiment, the remaining amount estimation unit 15 changes the internal impedance of the storage battery 2 modeled by the equivalent circuit model 20, in accordance with the SOC and the environmental temperature of the storage battery 2 which are used as the values influencing the internal impedance of the storage battery 2. Therefore, as compared to a case of setting the internal impedance as a constant as in the above conventional example, the state vector $x_k$ updated by the remaining amount estimation unit 15 can be more approximated into the actual state of the storage battery 2. As a result, it is possible to estimate the remaining stored power amount with higher accuracy.

In the present embodiment, in accordance with the SOC and the environmental temperature of the storage battery 2, the remaining amount estimation unit 15 changes two or more internal parameters among the internal parameters set for the respective elements for representing the internal impedance. Therefore, the internal impedance can be changed in more detail, whereby the state vector $x_k$ updated by the remaining amount estimation unit 15 can be further approximated into the actual state of the storage battery 2.

The above embodiment has shown, as an example, a case of employing both the environmental temperature of the storage battery 2 and the SOC of the storage battery 2 as the values influencing the internal impedance of the storage battery 2. However, at least one of them may be employed as the values influencing the internal impedance of the storage battery 2.

The above embodiment has shown, as an example, a case where all the resistance value $R_0$, the resistance value $R_1$, the capacitance $C_1$, the resistance value $R_2$, and the capacitance $C_2$ which are the internal parameters are changed in accordance with the values influencing the internal impedance of the storage battery 2. However, for example, among the internal parameters, the resistance value $R_2$ and the capacitance $C_2$ which are values relevant to the second RC circuit 24 may be set at fixed values, and the other internal parameters may be changed. Thus, some of the internal parameters may be set at fixed values.

4 Verification Test

Next, a verification test performed by the inventors about the accuracy of estimation of the SOC by the storage battery management device 3 will be described.

As a method for causing the storage battery management device 3 to calculate an estimated value of the SOC, the following three experimental examples were set.

Experimental example 1: case of changing the resistance value $R_0$, the resistance value $R_1$, the capacitance $C_1$, the resistance value $R_2$, and the capacitance $C_2$ in accordance with the environmental temperature and the SOC Experimental example 2: case of changing the resistance value $R_0$, the resistance value $R_1$, and the capacitance $C_1$ in accordance with the environmental temperature and the SOC Experimental example 3: case of changing the resistance value $R_0$, the resistance value $R_1$, the capacitance $C_1$, the resistance value $R_2$, and the capacitance $C_2$ in accordance with the SOC while fixing the environmental temperature at 25 degrees.

As a testing method, the storage battery system 1 in which the control unit 7 is configured from a small-sized microcomputer, is prepared, and the storage battery 2 is discharged from a full-charge state to the lower limit voltage, by a predetermined pattern, using a charge/discharge device. An observed value and the like of the storage battery 2 obtained during this period are given to the storage battery management device 3, and the storage battery management device 3 is caused to calculate an estimated value of the SOC of the storage battery 2.

As the storage battery 2, a lithium ion battery having the specifications shown in FIG. 6 was used.

As a true value with respect to the estimated value, the remaining stored power amount of the storage battery 2 measured by the charge/discharge device was used.

As a test condition, the environmental temperature of the storage battery 2 was set at 15 degrees, 25 degrees, 35 degrees, and 45 degrees, as shown in FIG. 16.

Figure 17:
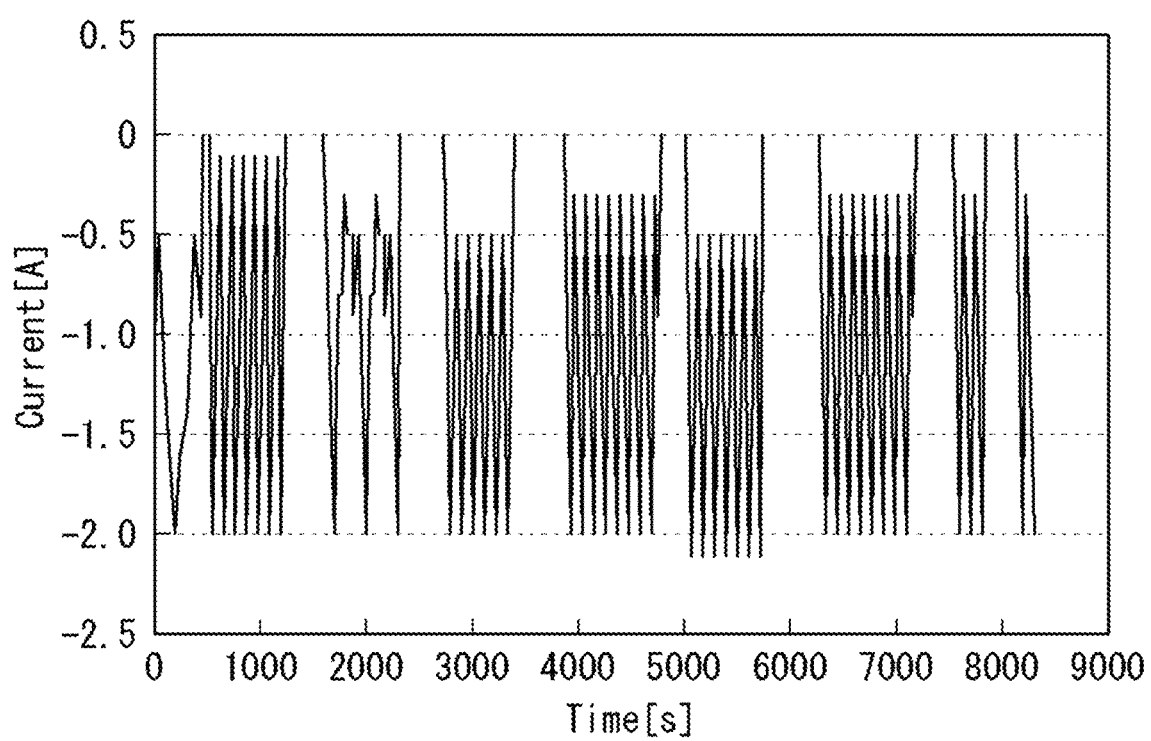
FIG. 17 is a diagram showing a charge/discharge pattern in the verification test.

The charge/discharge pattern executed by the charge/discharge device was set to a random pulse pattern, as shown in FIG. 17.

As an evaluation method, an error rate between the SOC estimated by the storage battery management device 3 and the true value obtained by the charge/discharge device was calculated, and evaluation was performed through comparison of the error rate.

Figure 18:
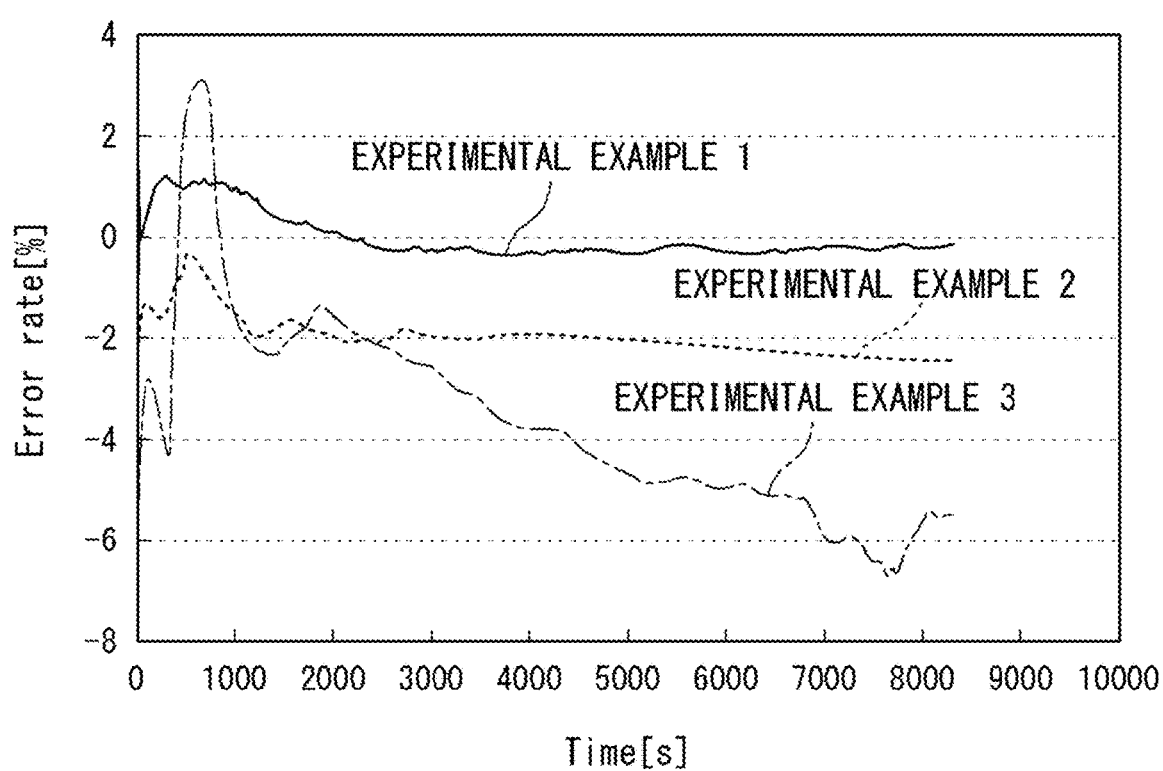
FIG. 18 is a graph showing temporal change in error, obtained by the verification test, when the environmental temperature was set at 15 degrees.

FIG. 18 is a graph showing temporal change in the error rate obtained by the verification test, when the environmental temperature was set at 15 degrees.

Figure 19:
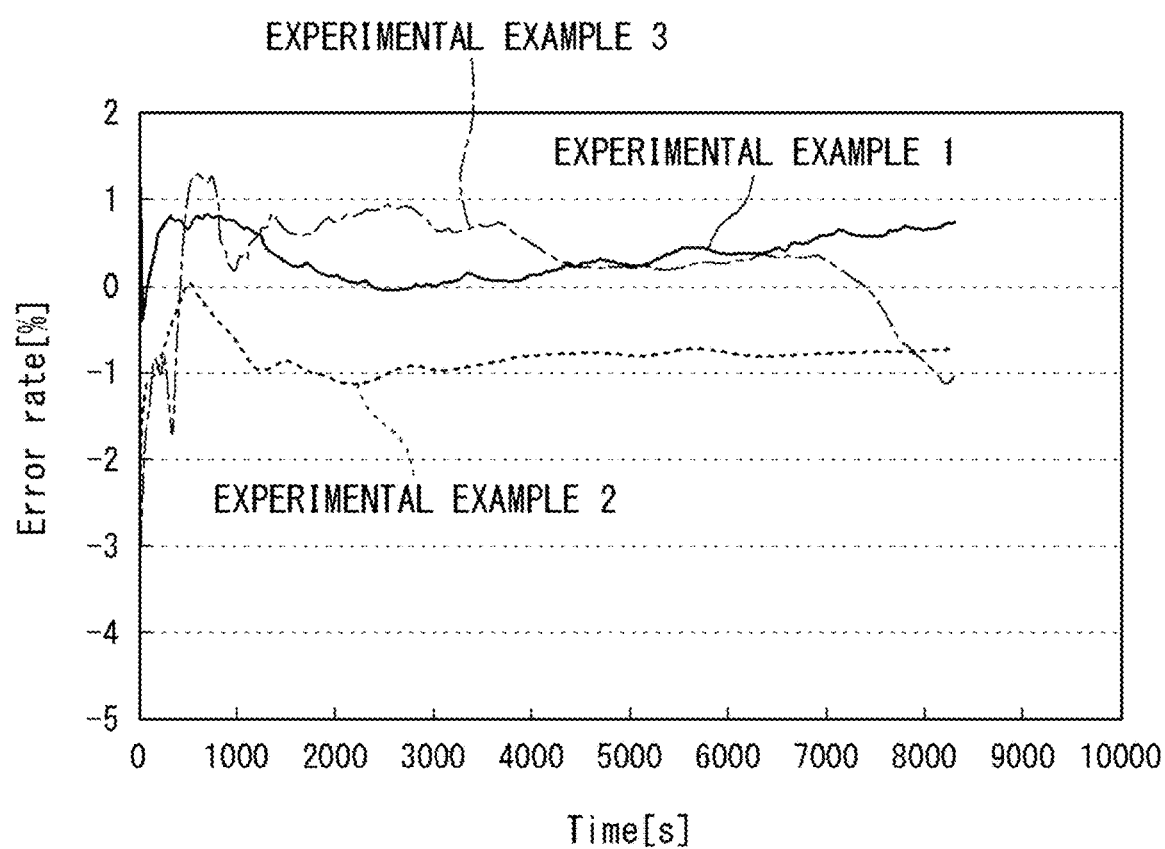
FIG. 19 is a graph showing temporal change in error, obtained by the verification test, when the environmental temperature was set at 25 degrees.

FIG. 19 is a graph showing temporal change in the error rate obtained by the verification test, when the environmental temperature was set at 25 degrees.

Figure 20:
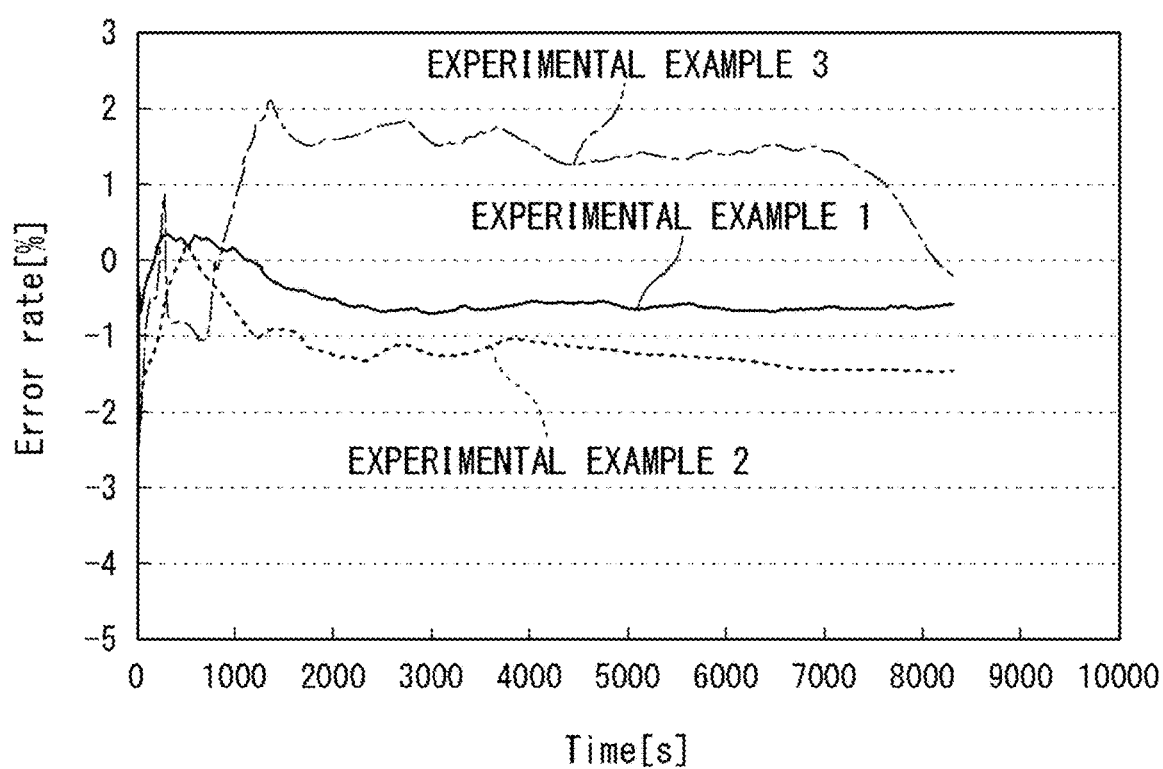
FIG. 20 is a graph showing temporal change in error, obtained by the verification test, when the environmental temperature was set at 35 degrees.

FIG. 20 is a graph showing temporal change in the error rate obtained by the verification test, when the environmental temperature was set at 35 degrees.

Figure 21:
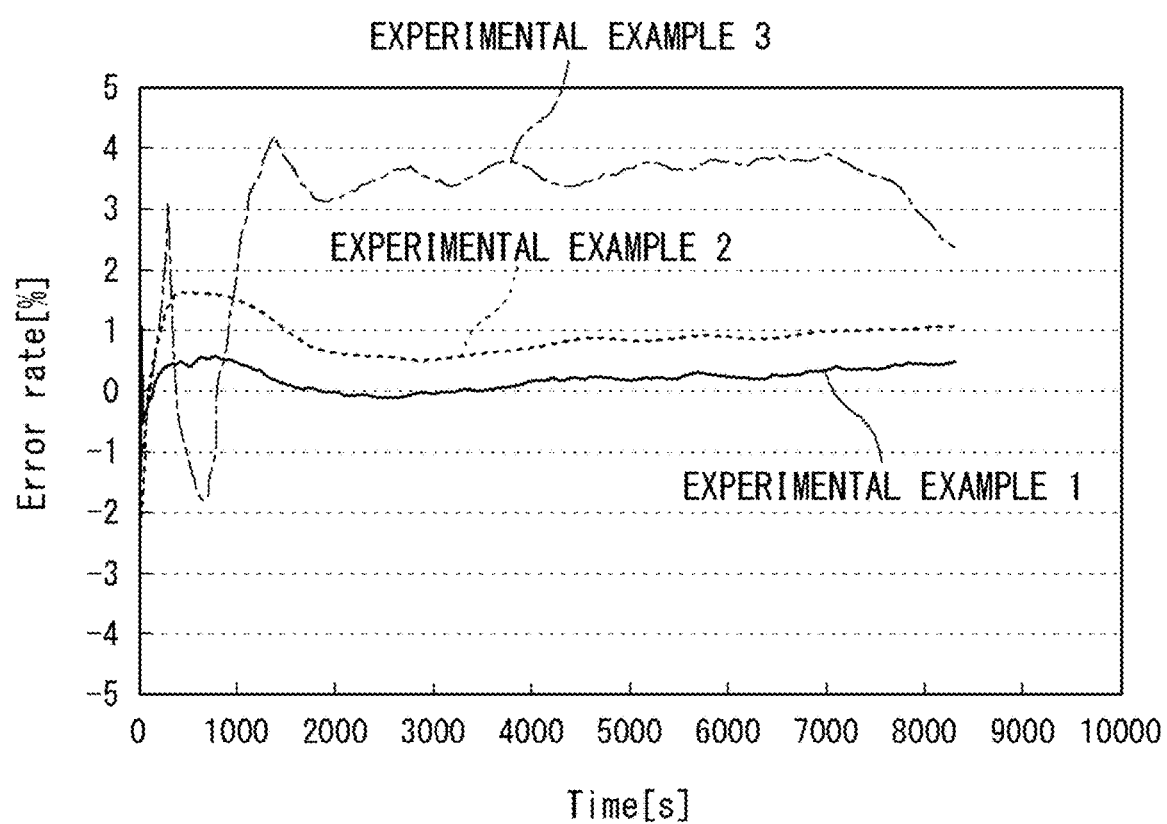
FIG. 21 is a graph showing temporal change in error, obtained by the verification test, when the environmental temperature was set at 45 degrees.

FIG. 21 is a graph showing temporal change in the error rate obtained by the verification test, when the environmental temperature was set at 45 degrees.

In FIG. 18 to FIG. 21, the horizontal axis indicates the elapsed time since the start of discharging from a full-charge state, and the vertical axis indicates the error rate.

Figure 23:
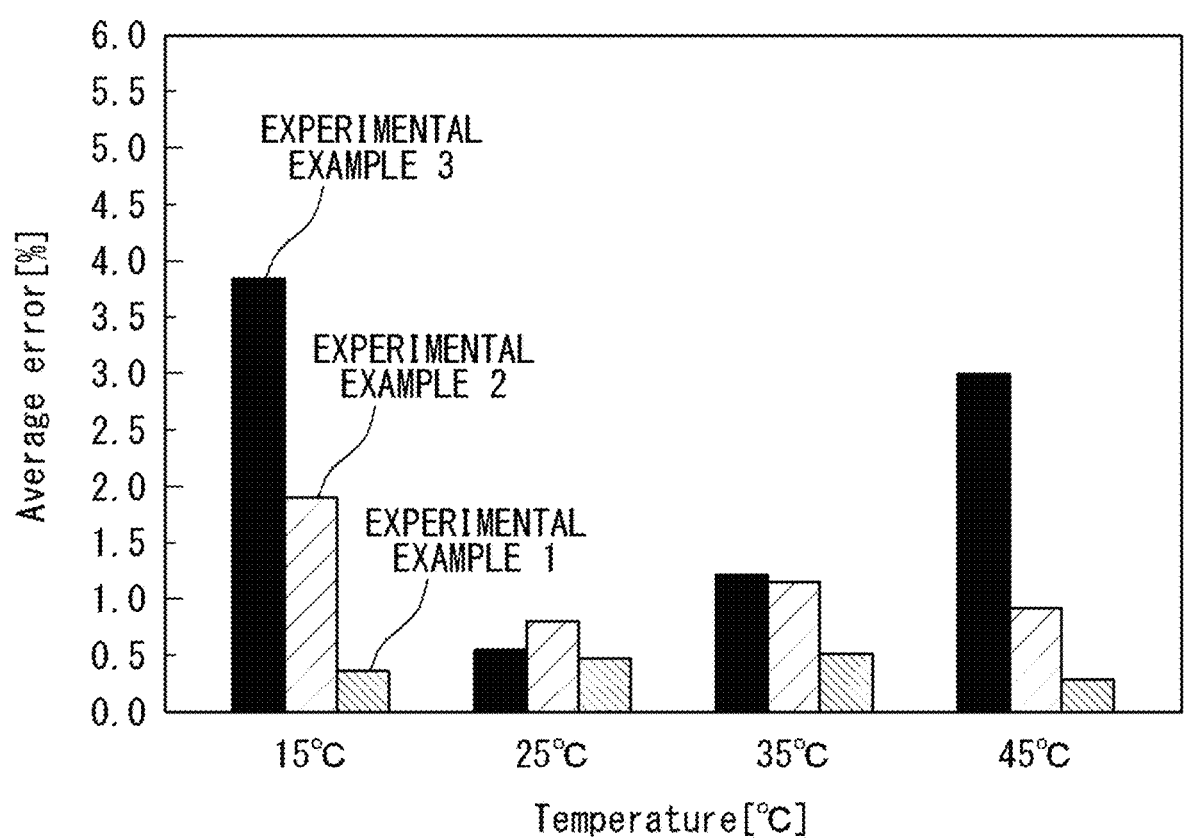
FIG. 23 is a graph showing the average value of the error rate at each environmental temperature in each experimental example shown in FIG. 22.

FIG. 22 is a diagram showing a result of calculation of an average value of the error rate at each environmental temperature in each experimental example. FIG. 23 is a graph showing the average value of the error rate at each environmental temperature in each experimental example shown in FIG. 22. In FIG. 23, a bar graph indicated by fine hatching slanting upward to the left indicates experimental example 1, a bar graph indicated by coarse hatching slanting upward to the right indicates experimental example 2, and a black filled bar graph indicates experimental example 3.

As shown in FIG. 18 to FIG. 23, in comparison between experimental example 3 in which the internal parameters were changed in accordance with only the SOC, and experimental examples 1, 2 in which the internal parameters were changed in accordance with the environmental temperature and the SOC, it can be confirmed that, at each environmental temperature, the error rates in experimental examples 1, 2 are smaller than that in experimental example 3, and by changing the internal parameters (internal impedance) in accordance with the environmental temperature and the SOC which are values indicating the state of the storage battery, the error rate can be reduced, and the SOC can be estimated with high accuracy.

Regarding the case where the internal parameters were changed in accordance with the environmental temperature, in FIG. 19, experimental example 3 indicates a case of changing the internal parameters in accordance with the SOC with the environmental temperature fixed at 25 degrees. Therefore, the values of the internal parameters are values corresponding to the environmental temperature (25 degrees). Thus, the error rate is stable at a comparatively small value.

On the other hand, in experimental example 3 in FIG. 18, FIG. 20, and FIG. 21 in which the environmental temperature was set at 15 degrees, 35 degrees, and 45 degrees, respectively, the values of the internal parameters are not values corresponding to the environmental temperature. Therefore, as shown in FIG. 22 and FIG. 23, the values of the error rates in these cases are greater than that in experimental example 3 in the test in which the environmental temperature was set at 25 degrees.

In FIG. 18, FIG. 20, and FIG. 21, in comparison between experimental example 3, and experimental examples 1, 2 in which the values of the internal parameters were changed in accordance with the environmental temperature and the SOC, the error rates in experimental examples 1, 2 are smaller than that in experimental example 3.

From these results, it can be confirmed that, by changing the internal parameters (internal impedance) in accordance with the environmental temperature of the storage battery 2, the error rate can be further reduced, and the SOC can be estimated with high accuracy.

Next, regarding the case where the internal parameters were changed in accordance with the SOC, in FIG. 18, experimental example 3 indicates a case of changing the internal parameters in accordance with the SOC with the environmental temperature fixed at 25 degrees, as described above. Therefore, the values of the internal parameters are not values corresponding to the SOC when the environmental temperature was 15 degrees.

On the other hand, in FIG. 18, in experimental examples 1, 2, the values of the internal parameters are values corresponding to the environmental temperature and the SOC.

Here, in FIG. 18, in comparison between experimental examples 1, 2 and experimental example 3, the average values of the error rates in experimental examples 1, 2 in which the values of the internal parameters are values corresponding to the SOC are smaller, and also, the temporal changes in the error rates in experimental examples 1, 2 appear more stable.

The same result is obtained also in FIG. 20 and FIG. 21.

From these results, it can be confirmed that, by changing the internal parameters (internal impedance) in accordance with the SOC of the storage battery 2, the SOC can be estimated stably and highly accurately.

From the above test result, it can be confirmed that, in the present embodiment, the SOC can be estimated with more stable accuracy and the SOC can be estimated with higher accuracy.

6 Others

The present invention is not limited to the above embodiments. For example, in the above embodiments, a lithium ion battery is used as the storage battery 2, but the storage battery management device 3 in the present embodiment is applicable also to other kinds of storage batteries.

REFERENCE SIGNS LIST 1 storage battery system
2 storage battery
3 storage battery management device
5 current sensor
6 voltage sensor
7 control unit
9 temperature sensor
10 processing unit
15 remaining amount estimation unit
20 equivalent circuit model
22 resistance element
23a resistance element
23b capacitor
24a resistance element
24b capacitor

The invention claimed is:

1. A remaining stored power amount estimation device for estimating a remaining stored power amount of a storage battery, the remaining stored power amount estimation device comprising:
an observation unit configured to observe a state of the storage battery; and
an estimation unit configured to, on the basis of a state vector and an observation vector, update the state vector using a Kalman filter and estimate the remaining stored power amount of the storage battery, the state vector representing the state of the storage battery on the basis of an equivalent circuit modeling the storage battery, the observation vector representing an observed value based on a result of observation by the observation unit, wherein
the state vector includes the remaining stored power amount of the storage battery,
the estimation unit changes an internal impedance of the storage battery modeled by the equivalent circuit, in accordance with a value influencing the internal impedance,
the value influencing the internal impedance includes an environmental temperature wherein the environmental temperature is the temperature around the storage battery and the remaining stored power amount of the storage battery included in the state vector updated by the estimation unit in an estimation step,
the estimation unit changes in the estimation step, the internal impedance changes based on an Arrhenius equation such that an internal parameter of the storage battery is equal to $A \times e^{B/RT}$,
wherein R is a gas constant, T is the environmental temperature of the storage battery, A and B are coefficients, and A is a function of the temperature of the storage battery.

2. The remaining stored power amount estimation device according to claim 1, wherein
the estimation unit changes, in accordance with the value influencing the internal impedance, two or more setting values among setting values set for elements for representing the internal impedance of the storage battery in the equivalent circuit.

3. The remaining stored power amount estimation device according to claim 1, wherein the estimation unit, while repeatedly updating the state vector, changes the internal impedance of the storage battery modeled by the equivalent circuit, in accordance with the value influencing the internal impedance, every time the state vector is updated.

4. The remaining stored power amount estimation device according to claim 1, wherein the internal parameter of the storage battery is a resistance value.

5. The remaining stored power amount estimation device according to claim 1, wherein the internal parameter of the storage battery is a capacitance value.

6. A method for estimating a remaining stored power amount of a storage battery, the method comprising:
an observation step of observing a state of the storage battery; and
an estimation step of, on the basis of a state vector and an observation vector, updating the state vector using a Kalman filter and estimating the remaining stored power amount of the storage battery, the state vector representing the state of the storage battery on the basis of an equivalent circuit modeling the storage battery, the observation vector representing an observed value based on a result of observation in the observation step, wherein
the state vector includes the remaining stored power amount of the storage battery,
in the estimation step, an internal impedance of the storage battery modeled by the equivalent circuit is changed in accordance with a value influencing the internal impedance,
the value influencing the internal impedance includes an environmental temperature wherein the environmental temperature is the temperature around the storage battery and the remaining stored power amount of the storage battery included in the state vector updated by the estimation unit in an estimation step,
the estimation unit changes in the estimation step, the internal impedance changes based on an Arrhenius equation such that an internal parameter of the storage battery is equal to $A \times e^{B/RT}$,
wherein R is a gas constant, T is the environmental temperature of the storage battery, A and B are coefficients, and A is a function of the temperature of the storage battery.

7. A non-transitory computer storage medium encoded with a computer program for causing a computer to execute a process for estimating a remaining stored power amount of a storage battery, the computer program causing the computer to execute:
an observation step of observing a state of the storage battery; and
an estimation step of, on the basis of a state vector and an observation vector, updating the state vector using a Kalman filter and estimating the remaining stored power amount of the storage battery, the state vector representing the state of the storage battery by a plurality of elements included in an equivalent circuit modeling the storage battery, the observation vector representing an observed value based on a result of observation in the observation step, wherein
the state vector includes the remaining stored power amount of the storage battery,
in the estimation step, an internal impedance of the storage battery modeled by the equivalent circuit is changed in accordance with a value influencing the internal impedance, the value influencing the internal impedance includes an environmental temperature wherein the environmental temperature is the temperature around the storage battery and the remaining stored power amount of the storage battery included in the state vector updated by the estimation unit in an estimation step, the estimation unit changes in the estimation step, the internal impedance changes based on an Arrhenius equation such that an internal parameter of the storage battery is equal to $A \times e^{B/RT}$, wherein R is a gas constant, T is the environmental temperature of the storage battery, A and B are coefficients, and A is a function of the temperature of the storage battery.

* * * * *